(12) United States Patent
Xia et al.

(10) Patent No.: US 10,981,231 B2
(45) Date of Patent: *Apr. 20, 2021

(54) METHODS FOR PRODUCTION OF SILVER NANOSTRUCTURES

(71) Applicant: University of Washington, Seattle, WA (US)

(72) Inventors: Younan Xia, St. Louis, MO (US); Sang-Hyuk Im, Pohang-Shi (KR); Yugang Sun, Naperville, IL (US); Yun Tack Lee, Seattle, WA (US); Benjamin Wiley, Boston, MA (US)

(73) Assignee: University of Washington, Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/031,681

(22) Filed: Jul. 10, 2018

(65) Prior Publication Data

US 2018/0311741 A1 Nov. 1, 2018

Related U.S. Application Data

(60) Continuation of application No. 15/171,578, filed on Jun. 2, 2016, which is a continuation of application
(Continued)

(51) Int. Cl.
*B22F 9/24* (2006.01)
*B22F 1/00* (2006.01)
(Continued)

(52) U.S. Cl.
CPC .............. *B22F 9/24* (2013.01); *B22F 1/0025* (2013.01); *B82Y 30/00* (2013.01); *C22B 11/04* (2013.01);
(Continued)

(58) Field of Classification Search
CPC ...... B22F 1/0025; B22F 1/004; B22F 1/0044; B22F 2001/0029; B22F 2001/0037;
(Continued)

(56) References Cited

U.S. PATENT DOCUMENTS 5,476,535 A  12/1995 Khasin
5,759,230 A  6/1998 Chow et al.
(Continued)

FOREIGN PATENT DOCUMENTS

JP  6122905 A  5/1994
WO  2002087749 A1  11/2002
(Continued)

OTHER PUBLICATIONS

Benjamin Wiley, Thurston Herricks, Yugang Sun, Younan Xia, "Polyol Synthesis of Silver Nanoparticles: Use of Chloride and Oxygen to Promote the Formation of Single-Crystal, Truncated Cubes and Tetrahedrons," Nano Letters, vol. 4, No. 9, 2004 published on Web Aug. 7, 2004), pp. 1733-1739. (Year: 2004).*
(Continued)

*Primary Examiner* — Vanessa T. Luk
(74) *Attorney, Agent, or Firm* — Christensen O'Connor Johnson Kindness PLLC

(57) ABSTRACT

Methods for producing silver nanostructures with improved dimensional control, yield, purity, monodispersity, and scale of synthesis.

19 Claims, 29 Drawing Sheets

— 100 nm

Related U.S. Application Data

No. 14/788,519, filed on Jun. 30, 2015, now Pat. No. 9,388,480, which is a continuation of application No. 13/367,217, filed on Feb. 6, 2012, now Pat. No. 9,109,270, which is a division of application No. 11/701,974, filed on Feb. 1, 2007, now abandoned.

(60) Provisional application No. 60/764,541, filed on Feb. 1, 2006.

(51) Int. Cl.

| | | |
|---|---|---|
| *C22C 5/06* | (2006.01) | |
| *C22B 3/00* | (2006.01) | |
| *B82Y 30/00* | (2011.01) | |
| *C22C 5/02* | (2006.01) | |
| *C30B 7/00* | (2006.01) | |
| *C30B 29/02* | (2006.01) | |
| *C30B 29/60* | (2006.01) | |
| *B82Y 40/00* | (2011.01) | |

(52) U.S. Cl.
CPC .................. *C22C 5/02* (2013.01); *C22C 5/06* (2013.01); *C30B 7/00* (2013.01); *C30B 29/02* (2013.01); *C30B 29/60* (2013.01); *B22F 2001/0037* (2013.01); *B22F 2009/245* (2013.01); *B22F 2301/255* (2013.01); *B22F 2304/05* (2013.01); *B22F 2998/10* (2013.01); *B82Y 40/00* (2013.01)

(58) Field of Classification Search
CPC ...... B22F 9/16; B22F 9/18; B22F 9/20; B22F 9/24; B22F 2301/255; B22F 2304/052; B22F 2304/054
See application file for complete search history.

(56) References Cited

U.S. PATENT DOCUMENTS

| | | | |
|---|---|---|---|
| 5,772,754 | A | 6/1998 | Tanaka et al. |
| 6,012,658 | A | 1/2000 | Khasin et al. |
| 6,413,487 | B1 | 7/2002 | Resasco et al. |
| 6,530,944 | B2 | 3/2003 | West et al. |
| 6,875,253 | B2 | 4/2005 | Daimon et al. |
| 7,348,365 | B2 | 3/2008 | Lee et al. |
| 7,566,360 | B2 | 7/2009 | Garbar et al. |
| 7,585,349 | B2 | 9/2009 | Xia et al. |
| 7,601,406 | B2 | 10/2009 | Garbar et al. |
| 7,736,693 | B2 | 6/2010 | Garbar et al. |
| 8,114,187 | B2 | 2/2012 | Xia et al. |
| 9,109,270 | B2 | 8/2015 | Xia et al. |
| 9,388,480 | B2 | 7/2016 | Xia et al. |
| 2001/0009119 | A1 | 7/2001 | Murray et al. |
| 2002/0070121 | A1 | 6/2002 | Nayfeh et al. |
| 2002/0115747 | A1 | 8/2002 | Feldheim et al. |
| 2003/0107024 | A1 | 6/2003 | Tai et al. |
| 2003/0136223 | A1 | 7/2003 | Jin et al. |
| 2003/0203282 | A1 | 10/2003 | Grugeon et al. |
| 2004/0020327 | A1 | 2/2004 | Hattori et al. |
| 2005/0056118 | A1 | 3/2005 | Xia et al. |
| 2005/0085379 | A1 | 4/2005 | Ishihara et al. |
| 2005/0214480 | A1 | 9/2005 | Garbar et al. |
| 2005/0229744 | A1* | 10/2005 | Kijima .................. B22F 1/0025 75/255 |
| 2006/0177660 | A1 | 8/2006 | Kumar et al. |
| 2007/0289409 | A1 | 12/2007 | Xia et al. |
| 2008/0003130 | A1 | 1/2008 | Xia et al. |
| 2009/0282948 | A1 | 11/2009 | Xia et al. |
| 2012/0125156 | A1 | 5/2012 | Xia et al. |

FOREIGN PATENT DOCUMENTS

| | | | |
|---|---|---|---|
| WO | 2003106573 | 12/2003 | |
| WO | 2004005413 | 1/2004 | |
| WO | WO-2004005182 A1 * | 1/2004 | ............... B22F 9/24 |

OTHER PUBLICATIONS

Zhenghua Wang, Jianwei Liu, Xiangying Chen, Junxi Wan, Yitai Qian, "A Simple Hydrothermal Route to Large-Scale Synthesis of Uniform Silver Nanowires," Chemistry: A European Journal, 11, 2005 (first published Dec. 15, 2004), pp. 160-163. (Year: 2004).*
Catherine J. Murphy, Tapan K. Sau, Anand M. Gole, Christopher J. Orendorff, Jinxin Gao, Linfeng Gou, Simona E. Hunyadi, Tan Li, "Anisotropic Metal Nanoparticles: Synthesis, Assembly, and Optical Applications," Journal of Physical Chemistry B, 2005 (published on Web Jun. 18, 2005), 109, pp. 13857-13870. (Year: 2005).*
Akhilesh Rai, Amit Singh, Absar Ahmad, Murali Sastry, "Role of Halide Ions and Temperature on the Morphology of Biologically Synthesized Gold Nanotriangles," Langmuir, 2006 (published on Web Dec. 16, 2005), 22, pp. 736-741. (Year: 2006).*
McFarland, et al.,Single Silver Nanoparticles as Real-Time Optical Sensors with Zeptomole Sensitivity, Nano Letters, vol. 3, No. 8 ,2003 ,pp. 1057-1062.
Merck & Co., Inc., et al.,The Merck Index, Twelfth Edition , 1996 ,p. 647.
Mirkin, et al.,Programming the Assembly of Two- and Three-Dimensional Architectures with DNA and Nanoscale Inorganic Building Blocks, Inorg. Chem., vol. 39, No. 11 ,2000 ,pp. 2258-2272.
Moore, et al.,Rapid and ultra-sensitive determination of enzyme activities using surface-enhanced resonance Raman scattering, Nature Biotechnology, vol. 22, No. 9 ,Sep. 2004 ,pp. 1133-1138.
Murphy, et al.,Controlling the Aspect Ratio of Inorganic Nanorods and Nanowires, Advance Materials, vol. 14, No. 1 ,2002 ,pp. 80-82.
Murphy,Catherine J. et al.,Nanocubes and Nanoboxes, Science, vol. 298 ,Dec. 13, 2002 ,pp. 2139-2141.
Ngo, et al.,Assemblies of cigar-shaped ferrite nanocrystals: orientation of the easy magnetization axes, Colloids and Surfaces A: Physicochern. Eng. Aspects, vol. 228 ,2003 ,pp. 107-117.
Nicewarner-Peña, et al.,Submicrometer Metallic Barcodes, Science, vol. 294, No. 5540 ,Oct. 5, 2001 ,pp. 137-141.
Özmetin, et al.,Kinetic Investigation of Reaction Between Metallic Silver and Nitric Acid Solutions, Chem. Eng. Technol., vol. 23, No. 8 ,2000 ,pp. 707-711.
Pastoriza-Santos, et al.,Synthesis of Silver Nanoprisms in DMF, Nano Letters, vol. 2, No. 8 ,2002 ,pp. 903-905.
Pinchuk, et al.,Substrate effect on the optical response of silver nanoparticles, Nanotechnology, vol. 15 ,2004 ,pp. 1890-1896.
Porter, et al.,Controlled Electroless Deposition of Noble Metal Nanoparticle Films on Germanium Surfaces, Nano Letters, vol. 2, No. 10 ,Sep. 7, 2002 ,pp. 1067-1071.
Prokes, et al.,Novel Methods of Nanoscale Wire Formation, MRS Bulletin ,Aug. 1999 ,pp. 13-19.
Puntes, et al.,Colloidal Nanocrystal Shape and Size Control: The Case of Cobalt, Science, vol. 291, No. 5511 ,Mar. 16, 2001 ,pp. 2115-2117.
Roy, et al.,Reflection and Absorption Techniques for Optical Characterization of Chemically Assembled Nanomaterials, Advance Materials, vol. 16, No. 6 ,2004 ,pp. 479-508.
Salzemann, et al.,Collections of Copper Nanocrystals Characterized by Different Sizes and Shapes: Optical Response of These Nanoobjects, J. Phys. Chem. B, vol. 108, No. 135 ,Aug. 10, 2004 ,pp. 13242-13248.
Sau, et al.,Room Temperature, High-Yield Synthesis of Multiple Shapes of Gold Nanoparticles in Aqueous Solution, J. Am. Chem. Soc., vol. 126, No. 28 ,2004 ,pp. 8648-8649.
Serafin, et al.,Surface science and the silver-catalyzed epoxidation of ethylene: an industrial perspective, Journal of Molecular Catalysis A: Chemical, vol. 131, No. 1-3 ,1998 ,pp. 157-168.

(56) References Cited

OTHER PUBLICATIONS

Sexton, et al.,Vibrational Spectra of Molecular and Atomic Oxygen on Ag(110), Chemical Physical Letters, vol. 76, No. 2 ,Dec. 1, 1980 ,pp. 294-297.
Sherry, et al.,Localized Surface Plasmon Resonance Spectroscopy of Single Silver Nanocubes, Nano Letters, vol. 5, No. 10 ,2005 ,pp. 2034-2038.
Silvert, et al.,Preparation of colloidal silver dispersions by the polyol process. Part 1—Synthesis and characterization, J Mater Chem, 6 ,Jan. 1996 ,pp. 573-577.
Silvert, et al.,Preparation of colloidal silver dispersions by the polyol process. Part 2—Mechanism of particle formation, J Mater Chem, 7(2) ,1997 ,pp. 293-299.
Smith, et al.,Dynamic Atomic-Level Rearrangements in Small Gold Particles, Science, vol. 233, No. 4766 ,Aug. 22, 1986 ,pp. 872-875.
Sosa, et al.,Optical Properties of Metal Nanoparticles with Arbitrary Shapes, J. Phys. Chem. B., vol. 107, No. 26 ,2003 ,pp. 6269-6275.
Spitsyn, et al.,Some Characteristics of the Process of Oxidizing Uranium by Tervalent Iron Ions, Atomnaya Energiya, vol. 17, No. 2 ,Aug. 1964 ,pp. 119-123 (original), pp. 827-831 (English-language translation).
Sun,Yugang et al.,Alloying and Dealloying Processes Involved in the Preparation of Metal Nanoshells Through a Galvanic Replacement Reaction, Nano Letters, vol. 0, ,Sep. 11, 2013 ,pp. A-D.
Sun,Yanguag et al.,Crystalline Silver Nanowires by Soft Solution Processing, Nano Letters, vol. 2, No. 2 ,2002 ,pp. 165-168.
Sun, et al.,Gold and silver nanoparticles: A class of chromophores with colors tunable in the range from 400 to 750 nm, Analyst, 128 ,Apr. 2003 ,pp. 686-691.
Sun,Yugang et al.,Increased Sensitivity of Surface Plasmon Resonance of Gold Nanoshells Compared to That of Sold Solid Colloids in Response to Environmental Changes, Analytical Chemistry, vol. 74, No. 20 ,Oct. 15, 2002 ,pp. 5297-5305.
Sun,Yugang et al.,Insights into the Replacement Reaction Between Silver Nanostructures and Chloroauric Acid in Aqueous Medium, Article to J. Am. Chem. Soc. ,Oct. 2003 ,23 pages.
Sun,Yugang et al.,Large-Scale Synthesis of Uniform Silver Nanowires Through a Soft, Self-Seeding, Polyol Process, Advanced Materials, 14, No. 11 ,Jun. 5, 2002 ,pp. 833-837.
Sun,Yugang et al.,Mechanistic Study on the Replacement Reaction Between Silver Nanostructure and chloroauric Acid in Aqueous Medium, J. Am. Chem. Soc. ,2004 ,pp. 3892-3901.
Sun,Yugang et al.,Metal Nanostructures with Hollow Interiors, Advanced Materials, vol. 15, No. 7-8 ,Apr. 17, 2003 ,pp. 641-646.
Sun,Yugang et al.,Multiple-Walled Nanotubes Made of Metals, Communication to Advanced Materials ,Jul. 2003.
Sun, et al.,Polyol Synthesis of Uniform Silver Nanowires: a Plausible Growth Mechanism and the Supporting Evidence, Nano Letters, vol. 3, No. 7 ,2003 ,pp. 955-960.
Sun,Yugang et al.,Shape-Controlled Synthesis of Gold and Silver Nanoparticles, Science, vol. 298 ,Dec. 13, 2002 ,pp. 2176-2179.
Sun,Yugang et al.,Template-Engaged Replacement Reaction: A One-Step Approace to the Large-Scale Synthesis of Metal Nanostructures with Hollow Interiors, Nano Letters, vol. 2, No. 5 ,Feb. 21, 2002 ,pp. 481-485.
Sun, et al.,Transformation of Silver Nanospheres into Nanobelts and Triangular Nanoplates through a Thermal Process, Nano Letters, vol. 3, No. 5 ,2003 ,pp. 675-679.
Sun,Yugang et al.,Uniform Silver Nanowires Synthesis by Reducing AgNO3 with Ethylene Glycol in the Presence of Seeds and Poly(Vinyl Pyrrolidone), Chem. Mater., 14, Oct. 8, 2002 ,Oct. 8, 2002 ,pp. 4736-4745.
Van Duyne,R.P. et al.,Molecular Plasmonics, Science, vol. 306, No. 5698 ,Nov. 5, 2004 ,pp. 985-986.
Wachs,I.E. et al.,Extending surface science studies to industrial reaction conditions: mechanism and kinetics of methanol oxidation over silver surfaces, Surface Science, vol. 544, No. 1 ,2003 ,pp. 1-4.
Wang, et al.,Steps, ledges and kinks on the surfaces of platinum nanoparticles of different shapes, Surface Science, vol. 380 , 19997 ,pp. 302-310.
Wang, et al.,Transmission Electron Microscopy of Shape-Controlled Nanocrystals and Their Assemblies, J. Phys. Chem. B, vol. 104, No. 6 ,2000 ,pp. 1153-1175.
Washabaugh, et al.,Purification of Aqueous Ethylene Glycol, Analytical Biochemistry, vol. 134, No. 1 ,1983 ,pp. 144-152.
Wei,G. et al.,""Shape Separation of Nanometer Gold Particles by Size-Exclusion Chromatography, Analytical Chemistry, vol. 71, No. 11 ,Jun. 1, 1999 ,pp. 2085-2091.
Wiley, et al.,Polyol Synthesis of Silver Nanostructures: Control of Product Morphology with Fe(II) or Fe(III) Species, Langmuir, vol. 21, No. 18 ,Aug. 30, 2005 ,pp. 8077-8080.
Wiley, et al.,Right Bipyramids of Silver: A New Shape Derived from Single Twinned Seeds, Nano Letters, vol. 6, No. 1 ,2006 ,pp. 765-768.
Wiley, et al.,Shape Control of Silver Nanoparticles, Chemistry a European Journal, vol. 11, No. 2 ,2005 ,pp. 454-463.
Wiley, et al.,Shape-Controlled Synthesis of Silver and Gold Nanostructures, MRS Bulletin, vol. 30, No. 5 ,May 2005 ,pp. 356-361.
Wu, et al.,Superconducting MgB2 Nanowires, Advance Materials, vol. 13, No. 19 ,2001 ,pp. 1487-1489.
U.S. Appl. No. 12/509,873, et al., Requirement for Restriction/Election ,dated Apr. 20, 2010 ,6 pages.
U.S. Appl. No. 12/509,873, et al., Final Office Action ,dated Apr. 21, 2015 ,13 pages.
U.S. Appl. No. 12/509,873, et al., Non-Final Office Action ,dated Aug. 2, 2010 ,31 pages.
U.S. Appl. No. 12/509,873, et al., Non-Final Office Action ,dated Aug. 7, 2014 ,53 pages.
U.S. Appl. No. 12/509,873, et al., Response to Non-Final Office Action ,dated Feb. 3, 2015 ,23 pages.
U.S. Appl. No. 12/509,873, et al., Notice Regarding a Non-Compliance or Non-Responsive Amendment ,dated Jan. 3, 2014 ,4 pages.
U.S. Appl. No. 12/509,873, et al., Response to Non-Final Office Action ,dated Jan. 31, 2011 ,27 pages.
U.S. Appl. No. 12/509,873, et al., Response to Notice Regarding a Non-Compliance or Non-Responsive Amendment ,dated Jan. 7, 2014 ,16 pages.
U.S. Appl. No. 12/509,873, et al., Response to Final Office Action and Request for Continued Examination ,dated Jun. 29, 2011 ,31 pages.
U.S. Appl. No. 12/509,873, et al., Response to Final Office Action and Request for Continued Examination ,dated Jun. 6, 2014 ,25 pages.
U.S. Appl. No. 12/509,873, et al., Final Office Action ,dated Mar. 20, 2014 ,14 pages.
U.S. Appl. No. 12/509,873, et al., Final Office Action ,dated Mar. 29, 2011 ,19 pages.
U.S. Appl. No. 12/509,873, et al., Non-Final Office Action ,dated May 14, 2013 ,21 pages.
U.S. Appl. No. 12/509,873, et al., Response to Requirement for Restriction/Election ,dated May 20, 2010 ,12 pages.
U.S. Appl. No. 12/509,873, et al., Response to Non-Final Office Action ,dated Nov. 8, 2013 ,26 pages.
U.S. Appl. No. 12/509,873, et al., Non-Final Office Action ,dated Oct. 10, 2012 ,16 pages.
U.S. Appl. No. 12/509,873, et al., Response to Final Office Action and Request for Continued Examination ,dated Oct. 21, 2015 ,17 pages.
U.S. Appl. No. 13/367,217, et al., Response to Non-Final Office Action ,dated Apr. 11, 2013 ,16 pages.
U.S. Appl. No. 13/367,217, et al., Notice of Allowance ,dated Apr. 7, 2015 ,16 pages.
U.S. Appl. No. 13/367,217, et al., Response to Final Office Action and Request for Continued Examination ,dated Aug. 30, 2013 ,29 pages.
U.S. Appl. No. 13/367,217, et al., Response to Final Office Action and Request for Continued Examination ,dated Dec. 12, 2014 ,21 pages.
U.S. Appl. No. 13/367,217, et al., Notice of Allowance ,dated Feb. 20, 2015 ,10 pages.

(56) References Cited

OTHER PUBLICATIONS

U.S. Appl. No. 13/367,217, et al., Non-Final Office Action ,dated Jan. 14, 2013 ,26 pages.
U.S. Appl. No. 13/367,217, et al., Notice of Allowance ,dated Jan. 26, 2015 ,9 pages.
U.S. Appl. No. 13/367,217, et al., Final Office Action ,dated Jun. 12, 2014 ,19 pages.
U.S. Appl. No. 13/367,217, et al., Supplemental Response or Supplemental Amendment ,dated Mar. 12, 2013 ,9 pages.
U.S. Appl. No. 13/367,217, et al., Non-Final Office Action ,dated Mar. 19, 2015 ,16 pages.
U.S. Appl. No. 13/367,217, et al., Response to Non-Final Office Action ,dated Mar. 24, 2014 ,16 pages.
U.S. Appl. No. 13/367,217, et al., Response to Non-Final Office Action ,dated Mar. 25, 2015 ,8 pages.
U.S. Appl. No. 13/367,217, et al., Notice of File Corrected Application Paper ,dated Mar. 5, 2015 ,4 pages.
U.S. Appl. No. 13/367,217, et al., Final Office Action ,dated May 2, 2013 ,11 pages.
U.S. Appl. No. 13/367,217, et al., Non-Final Office Action ,dated Oct. 22, 2013 ,16 pages.
U.S. Appl. No. 14/788,519, et al., Response to Notice of Incomplete Reply to Notice to File Corrected Application Papers ,dated Aug. 11, 2015 ,174 pages.
U.S. Appl. No. 14/788,519, et al., Notice of Incomplete Reply ,dated Aug. 4, 2015 ,3 pages.
U.S. Appl. No. 14/788,519, et al., Notice to File Corrected Application Papers ,dated Jul. 20, 2015 ,7 pages.
U.S. Appl. No. 14/788,519, et al., Preliminary Amendment and Response to Notice to File Corrected Application Papers ,dated Jul. 27, 2015 ,89 pages.
U.S. Appl. No. 14/788,519, et al., Preliminary Amendment ,dated Jun. 30, 2015 ,6 pages.
U.S. Appl. No. 14/788,519, et al., Non-Final Office Action ,dated Sep. 29, 2015 ,28 pages.
U.S. Appl. No. 90/013,318, et al., Response to Office Action ,dated Apr. 10, 2015 ,34 pages.
U.S. Appl. No. 90/013,318, et al., Request for Ex Parte Reexamination of U.S. Pat. No. 7,585,349 ,Aug. 13, 2014 ,106 pages.
U.S. Appl. No. 90/013,318, et al., Notice of Assignment of Reexamination Request ,Aug. 19, 2014 ,2 pages.
U.S. Appl. No. 90/013,318, et al., Notice of Reexamination Request Filing (Third Party Requestor) ,dated Aug. 19, 2014 ,21 pages.
U.S. Appl. No. 90/013,318, et al., Ex Parte Reexamination Action ,Feb. 12, 2015 ,15 pages.
U.S. Appl. No. 90/013,318, et al., Reexam Final Office Action ,dated Jul. 24, 2015 ,22 pages.
U.S. Appl. No. 90/013,318, et al., Response to the Ex Parte Reexamination Interview Summary ,Jun. 12, 2015 ,9 pages.
U.S. Appl. No. 90/013,318, et al., Ex Parte Reexamination Interview Summary ,May 19, 2015 ,4 pages.
U.S. Appl. No. 90/013,318, et al., Order Granting the Request for Ex Parte Reexamination ,Sep. 19, 2014 ,16 pages.
U.S. Appl. No. 90/013,318, et al., Response to Office Action ,dated Sep. 21, 2015 ,29 pages.
U.S. Appl. No. 90/013,318, et al., ExParte Reexamination Communication Transmittal Form ,Sep. 30, 2015 ,4 pages.
Ajayan, et al.,Quasimelting and phases of small particles, Physical Review Letters, vol. 60, No. 7 ,Feb. 15, 1988 ,pp. 585-587.
U.S. Appl. No. 15/171,578, et al.,Xia, et al., Office Action dated Jan. 24, 2019 for U.S. Appl. No. 15/171,578.
U.S. Appl. No. 15/171,578, et al.,Xia, et al., Restriction Requirement dated Oct. 1, 2018 for U.S. Appl. No. 15/171,578.
Xia, et al., Notice of Allowance dated Feb. 15, 2019 for U.S. Appl. No. 14/919,515.
U.S. Appl. No. 10/732,910, et al., Notice of Allowance ,dated Apr. 27, 2009 ,8 pages.
U.S. Appl. No. 10/732,910, et al., Examiner Interview Summary ,dated Aug. 11, 2008 ,2 pages.
U.S. Appl. No. 10/732,910, et al., Response to Non-Final Office Action ,dated Aug. 5, 2008 ,28 pages.
U.S. Appl. No. 10/732,910, et al., Response to Final Office Action and Request for Continued Examination ,dated Feb. 23, 2009 ,29 pages.
U.S. Appl. No. 10/732,910, et al., Non-Final Office Action ,dated Feb. 5, 2008 ,13 pages.
U.S. Appl. No. 10/732,910, et al., Notice of Incomplete Reply ,dated Jul. 26, 2004.
U.S. Appl. No. 10/732,910, et al., Notice of Allowance ,dated Jun. 11, 2009 ,3 pages.
U.S. Appl. No. 10/732,910, et al., Supplemental Notice of Allowability ,dated Jun. 11, 2009 ,3 pages.
U.S. Appl. No. 10/732,910, et al., Non-Final Office Action ,dated Jun. 22, 2007 ,31 pages.
U.S. Appl. No. 10/732,910, et al., Notice to File Missing Parts ,Mar. 18, 2004.
U.S. Appl. No. 10/732,910, et al., Requirement for Restriction/Election ,dated Mar. 23, 2007 ,10 pages.
U.S. Appl. No. 10/732,910, et al., Decision on Request for Patent Term Adjustment including Request for Reconsideration ,Mar. 9, 2010.
U.S. Appl. No. 10/732,910, et al., Preliminary Amendment ,dated May 18, 2005 ,5 pages.
U.S. Appl. No. 10/732,910, et al., Response to Requirement for Restriction/Election ,dated May 29, 2007 ,7 pages.
U.S. Appl. No. 10/732,910, et al., Response to Non-Final Office Action ,dated Nov. 21, 2007 ,28 pages.
U.S. Appl. No. 10/732,910, et al., Statement of Facts Accompanying Request for Reconsideration of Patent Term Adjustment , Nov. 9, 2009.
U.S. Appl. No. 10/732,910, et al., Application for Patent Term Adjustment including Request for Reconsideration ,Nov. 9, 2009 ,19 pages.
U.S. Appl. No. 10/732,910, et al., Final Office Action ,dated Oct. 21, 2008 ,11 pages.
U.S. Appl. No. 10/732,910, et al., Notice of Incomplete Reply ,Sep. 20, 2004.
U.S. Appl. No. 10/732,910, et al., Replacement Drawing Sheets ,Sep. 20, 2004.
U.S. Appl. No. 10/732,910, et al., Replacement Drawing Sheets (Set a) ,Sep. 20, 2004.
U.S. Appl. No. 10/732,910, et al., Replacement Drawing Sheets (Set B) ,Sep. 20, 2004.
U.S. Appl. No. 10/732,910, et al., Response to Notice of Incomplete Reply ,Sep. 20, 2004.
U.S. Appl. No. 11/197,745, et al., Non-Final Office Action ,dated Apr. 13, 2010 ,19 pages.
U.S. Appl. No. 11/197,745, et al., Response to Non-Final Office Action ,dated Apr. 3, 2009 ,27 pages.
U.S. Appl. No. 11/197,745, et al., Response to Non-Final Office Action ,dated Aug. 13, 2010 ,24 pages.
U.S. Appl. No. 11/197,745, et al., Response to Non-Final Office Action ,dated Aug. 15, 2008 ,20 pages.
U.S. Appl. No. 11/197,745, et al., Response to Final Office Action and Request for Continued Examination ,dated Aug. 2, 2011 ,18 pages.
U.S. Appl. No. 11/197,745, et al., Non-Final Office Action ,dated Dec. 3, 2008 ,27 pages.
U.S. Appl. No. 11/197,745, et al., Response to Final Office Action and Request for Continued Examination ,dated Feb. 1, 2010 ,30 pages.
U.S. Appl. No. 11/197,745, et al., Non-Final Office Action ,dated Feb. 15, 2008 ,30 pages.
U.S. Appl. No. 11/197,745, et al., Final Office Action ,dated Jul. 30, 2009 ,47 pages.
U.S. Appl. No. 11/197,745, et al., Response to Non-Final Office Action ,dated Mar. 2011 ,28 pages.
U.S. Appl. No. 11/197,745, et al., Final Office Action ,dated May 6, 2011 ,24 pages.
U.S. Appl. No. 11/197,745, et al., Response to Notice to File Missing Parts ,Nov. 14, 2005.

(56) References Cited

OTHER PUBLICATIONS

U.S. Appl. No. 11/197,745, et al., Notice of Allowance ,dated Oct. 13, 2011 ,19 pages.
U.S. Appl. No. 11/197,745, et al., Non-Final Office Action ,dated Oct. 28, 2010 ,41 pages.
U.S. Appl. No. 11/197,745, et al., Notice to File Missing Parts ,Sep. 15, 2005.
U.S. Appl. No. 11/701,974, et al., Non-Final Office Action ,dated Dec. 21, 2010 ,18 pages.
U.S. Appl. No. 11/701,974, et al., Requirement for Election/Restriction ,Feb. 9, 2008 ,12 pages.
U.S. Appl. No. 11/701,974, et al., Response to Non-Final Office Action ,dated Jun. 20, 2011 ,15 pages.
U.S. Appl. No. 11/701,974, et al., Response to Restriction/Election Requirement ,Jun. 9, 2009 ,17 pages.
U.S. Appl. No. 11/701,974, et al., Preliminary Amendment ,Mar. 19, 2008 ,6 pages.
U.S. Appl. No. 11/701,974, et al., Replacement Drawings associated with Amendment and Response ,Mar. 29, 2010.
U.S. Appl. No. 11/701,974, et al., Response to Non-Final Office Action ,dated Mar. 29, 2010 ,69 pages.
U.S. Appl. No. 11/701,974, et al., Notice of Allowance ,dated May 27, 2010 ,15 pages.
U.S. Appl. No. 11/701,974, et al., Non-Final Office Action ,dated Sep. 29, 2009 ,28 pages.
U.S. Appl. No. 11/701,974, et al., Final Office Action ,dated Sep. 6, 2011 ,8 pages.
U.S. Appl. No. 11/701,974, et al., Notice of Allowance ,dated Sep. 9, 2010 ,21 pages.
U.S. Appl. No. 12/509,873, et al., Response to Non-Final Office Action ,dated Apr. 10, 2013 ,20 pages.
Xia, et al., Amendment and Response to Non-Final Office Action dated Jun. 22, 2018 for U.S. Appl. No. 14/919,515.
Xia, et al., Office Action dated May 3, 2018 for U.S. Appl. No. 14/919,515.
Xia, et al., Office Action dated Oct. 9, 2018 for U.S. Appl. No. 14/919,515.
Xia, et al.,One-Dimensional Nanostructures: Synthesis, Characterization, and Applications, Advance Materials, vol. 15, No. 5 , 2003 ,pp. 353-389.
Xiong, et al.,Size-Dependence of Surface Plasmon Resonance and Oxidation for Pd Nanocubes Synthesized via a Seed Etching Process, Nano Letters, vol. 5, No. 7 ,Jun. 3, 2005 ,pp. 1237-1242.
Yener, et al.,Synthesis of Nanosized Silver Platelets in Octylamine-Water Bilayer Systems, Langmuir, vol. 18, No. 22 ,2002 ,pp. 8692-8699.
Yguerabide, et al.,Light-scattering submicroscopic particles as highly fluorescent analogs and their use as tracer labels in clinical and biological applications, Analytical Biochemistry, vol. 262, Article No. AB982759 ,1998 ,pp. 137-156.
Zettsu, et al.,Synthesis, Stability, and Surface Plasmonic Properties of Rhodium Multipods, and Their Use as Substrates for Surface-Enhanced Raman Scattering, Angewandte Chemie Int. Ed., vol. 45, No. 8 ,2006 ,pp. 1288-1292.
Zhang, et al.,DPN-Generated Nanostructures Made of Gold, Silver, and Palladium, Chem Mater, vol. 16, No. 8 ,2004 ,pp. 1480-1484.
Zhang et al.,Protective Mechanism of Ultrafine Silver Powder Synthesized by Chemical Reduction Processes, J . Solid State Chem, 121(1) ,Jan. 1996 ,pp. 105-110.
Andrew, et al.,Energy Transfer Across a Metal Film Mediated by Surface Plasmon Polaritons, Science, vol. 306, No. 5698 ,2004 ,pp. 1002-1005.
Ayyappan,S. et al.,Nanoparticles of Ag. Pd, and Cu produced by alcohol reduction of the salts, Journal of Nanoparticle Research, vol. 12, No. 2 ,Feb. 1997 ,pp. 398-401.
Bonet, et al.,Study of interaction of ethylene glycol/PVP phase on noble metal powders prepared by polyol process, Bull Mater Sci, 23(3) ,Jun. 2000 ,pp. 165-168.

Buatier De Mongeo, et al.:O2 dissociation on Ag(001): the role of kink sites, Chemical Physical Letters, vol. 270, No. 3-4 ,May 23, 1997 ,pp. 345-350.
Campbell,C.T. et al.,Atomic and Molecular Oxygen Adsorption on Ag(111), Surface Science, vol. 157 ,1985 , pp. 43-60.
Cao, et al.,Nanoparticles with Raman Spectroscopic Fingerprints for DNA and RNA Detection, Science, vol. 297, No. 5586 ,Aug. 30, 2002 ,pp. 1536-1540.
Carmona, et al.,An experimental model for studying the effect of anisotropy on percolative conduction, J. Physique Letters, vol. 41, No. 22 ,1980 ,pp. L531-L533.
Carotenuto,G. et al.,Preparation and Characterization of Nano-Sized Ag/PVP Composites for Optical Applications, the European Physical Journal B ,2000 ,pp. 11-17.
Chen, et al.,Colloidal Platinum Nanoparticles Stabilized by Vinyl Polymers with Amide Side Chains: Dispersion Stability and Catalytic Activity in Aqueous Electrolyte Solutions, J. Colloid & Interface Sci., vol. 225 ,2000 ,pp. 349-358.
Chen, et al.,Monopod, Bipod, Tripod, and Tetrapod Gold Nanocrystals, J. Am. Chem. Soc., vol. 125, No. 52 ,2003 ,pp. 16186-16187.
Chen, et al.,Polyol Synthesis of Platinum Nanostructures: Control of Morphology through the Manipulation of Reduction Kinetics, Angewandte Chemie Int. Ed., vol. 44, No. 17 ,2005 ,pp. 2589-2592.
Chen, et al.,Silver Nanodisks: Synthesis, Characterization, and Self-Assembly, the Journal of Physical Chemistry B, vol. 106, No. 42 ,Oct. 24, 2002 ,pp. 10777-10781.
Chen, et al.,Single-crystal nanowires of platinum can be synthesized by controlling the reaction rate of a polyol process, J. Am. Chem. Soc., vol. 126, No. 35 ,2004 ,pp. 10854-10855.
Chen, et al.,Synthesis and Characterization of Truncated Triangular Silver Nanoplates, Nano Letters, vol. 2, No. 9 ,2002 ,pp. 1003-1007.
Cleveland, et al.,The energetics and structure of nickel clusters: Size dependence, J. Chem. Phys., vol. 94, No. 11 ,1991 ,pp. 7376-7396.
Davies, et al.,The development and functions of silver in water purification and disease control, Catalysis Today, vol. 36, No. 1 ,1997 ,pp. 107-114.
Doraiswamy, et al.,Electron beam induced small particle transformations: temperature, Surface Science, vol. 348, No. 1-2 ,1996 ,pp. L67-L69.
Draine, et al.,Discrete-Dipole Approximation for Scattering Calculations, J. Opt. Soc. Am. A, vol. 11, No. 4 ,Apr. 1994 ,pp. 1491-1499.
Ducamp-Sanguesa,C. et al.,Synthesis and Characterization of Fine and Monodisperse Silver Particles of Uniform Shape, Journal of Solid State Chemistry, vol. 100 ,1992 ,pp. 272-280.
Fang, et al.,Sub-Diffraction-Limited Optical Imaging with a Silver Superlens, Science, vol. 308, No. 5721 ,Apr. 22, 2005 ,pp. 534-537.
Fievet, et al.,Preparing Monodisperse Metal Powders in Micrometer and Submicrometer Sizes by the Polyol Process, MRS Bulletin ,Dec. 1989 ,pp. 29-34.
Goia,D.V, et al.,Preparation and formation mechanisms of uniform metallic particles in homogeneous solutions, Journal of Materials Chemistry, vol. 14 ,2004 ,pp. 451-458.
Haes, et al.,A Nanoscale Optical Biosensor: Sensitivity and Selectivity of an Approach Based on the Localized Surface Plasmon Resonance Spectroscopy of Triangular Silver Nanoparticles, J. Am. Chem. Soc., vol. 124 ,2002 ,p. 35, pp. 10596-10604.
Haes, et al.,Plasmonic Materials for Surface-Enhanced Sensing and Spectroscopy, MRS Bulletin, vol. 30, No. 5 ,May 2005 ,pp. 368-375.
Hao, et al.,Electromagnetic fields around silver nanoparticles and dimers, the Journal of Chemical Physics, vol. 120, No. 1 ,Jan. 1, 2004 ,pp. 357-366.
Hao, et al.,Synthesis and Optical Properties of "Branched" Gold Nanocrystals, Nano Letters, vol. 4, No. 2 ,2004 ,pp. 327-330.
Harris,P.J.F. et al.,Sulphur-induced faceting of platinum catalyst particles, Nature, vol. 323, No. 6091 ,Oct. 30, 1986 ,pp. 792-794.
Haynes, et al.,Surface-Enhanced Raman Spectroscopy, Analytical Chemistry, vol. 77, No. 338A-346A ,Sep. 1, 2005.
Hegde,M.S. et al.,Synthesis and chemical reactivity of polyol prepared monodisperse nickel powders, Solid State Ionics, vol. 93 ,1997 ,pp. 33-50.

(56) References Cited

OTHER PUBLICATIONS

Hofmeister, et al.,Configuration of twins in glass-embedded silver nanoparticles of various origin, Physica Status Solidi A, vol. 202, No. 12 ,2005 ,pp. 2321-2329.

Ijima, et al.,Structural instability of ultrafine particles of metals, Physical Review Letters, vol. 56, No. 6 ,Feb. 10, 1986 ,pp. 616-621.

Im, et al.,Large-Scale Synthesis of Silver Nanocubes: The Role of HCl in Promoting Cube Perfection and Monodispersity, Angew. Chem. Int. Ed., 44(14) ,2005 ,pp. 2154-2157.

Jana, et al.,Anisotropic Chemical Reactivity of Gold Spheroids and Nanorods, Langmuir, vol. 18, No. 3 ,Jan. 10, 2002 ,pp. 922-927.

Jana, et al.,Wet Chemical Synthesis of Silver Nanorods and Nanowires of Controllable Aspect Ratio, the Royal Society of Chemistry , 2001 ,pp. 617-618.

Jensen, et al.,Electrodynamics of Noble Metal Nanoparticles and Nanoparticle Clusters, Journal of Cluster Science, vol. 10, No. 2 ,1999 ,pp. 295-317.

Jeyadevan, et al.,Towards Direct Synthesis of fct-FePt Nanoparticles by Chemical Route, Journal of Applied Physics, vol. 93, No. 10 ,May 15, 2003 ,pp. 7574-7576.

Jin, et al.,Controlling anisotropic nanoparticle growth through plasmon excitation, Nature, vol. 425 ,Oct. 2, 2003 , pp. 487-490.

Jin, et al.,Photoinduced Conversion of Silver Nanospheres to Nanoprisms, Science, vol. 294, No. 5548 ,Nov. 30, 2001 ,pp. 1901-1903.

Jin, et al.,Thermally-Induced Formation of Atomic Au Clusters and Conversion into Nanocubes, J. Am. Chem. Soc., vol. 126, No. 32 ,2004 ,pp. 9900-9901.

Kim, et al.,Photochemical Synthesis of Gold Nanorods, J. Am. Chem. Soc., vol. 124, No. 48 ,2002 ,pp. 14316-14317.

Kim, et al.,Platonic Gold Nanocrystals, Angew. Chem. Int. Ed., vol. 43, No. 28 ,2004 ,pp. 3673-3677.

Kneipp, et al.,Single Molecule Detection Using Surface-Enhanced Raman Scattering (SERS), Physical Review Letters, vol. 78, No. 9 ,Mar. 3, 1997 ,pp. 1667-1670.

Kottman, et al.,Plasmon resonances of silver nanowires with a nonregular cross section, Physical Review B, vol. 64 ,2001 ,pp. 235402-1-235402-10.

Kovtyukhova, et al.,Nanowires as Building Blocks for Self-Assembling Logic and Memory Circuits, Chemistry a European Journal, vol. 8, No. 19 ,2002 ,pp. 4354-4363.

Krenn,J.R. et al.,Nanoparticle waveguides: Watching energy transfer, Nature Materials, vol. 2 ,Apr. 2003 ,pp. 210-211.

Li, et al.,Ultrasonic Solvent Induced Morphological Change of Au Colloids, Material Letters, vol. 58, Issue 1-2 ,2004 ,pp. 196-199.

Lin, et al.,Two-Step Functionalization of Neutral and Positively Charged Thiols onto Citrate-Stabilized Au Nanoparticles, J. Phys. Chem. B., vol. 108, No. 7 ,2004 ,pp. 2134-2139.

Lofton, et al.,Mechanisms Controlling Crystal Habits of Gold and Silver Colloids, Advance Functional Materials, vol. 15, No. 7 , 2005 ,pp. 1197-1208.

Maier, et al.,Optical pulse propagation in metal nanoparticle chain waveguides, Physical Review B, vol. 67 ,2003 ,pp. 205402-1-205402-5.

Maillard, et al.,Silver Nanodisks, Advance Materials, vol. 14, No. 15 ,2002 ,pp. 1084-1086.

\* cited by examiner

— 500 nm

— 500 nm

—— 20 nm

—— 500 nm 100 nm 100 nm 100 nm

— 200 nm

— 200 nm

— 200 nm

— 200 nm

— 200 nm

— 200 nm

METHODS FOR PRODUCTION OF SILVER NANOSTRUCTURES

CROSS-REFERENCE TO RELATED APPLICATIONS

This application is a continuation of U.S. application Ser. No. 15/171,578, filed Jun. 2, 2016, which is a continuation of U.S. application Ser. No. 14/788,519, filed Jun. 30, 2015, which is a continuation of U.S. application Ser. No. 13/367, 217, filed Feb. 6, 2012, which is a divisional of U.S. application Ser. No. 11/701,974, filed Feb. 1, 2007, which claims the benefit of and priority to U.S. Provisional Application No. 60/764,541, filed Feb. 1, 2006; the entire contents of each of the foregoing applications are hereby incorporated by reference herein.

FEDERALLY SPONSORED RESEARCH OR DEVELOPMENT

This invention was made with U.S. Government support under grant number N-00014-01-1-0976 awarded by the Department of Defense, Department of the Navy, grant number R01 CA120480-01 awarded by the National Institutes of Health, and grant numbers DMR-9983893, DMR-0451788, and DMR-0451780 awarded by the National Science Foundation. The U.S. Government has certain rights in this invention.

TECHNICAL FIELD

The present disclosure relates to nanotechnology and the production of nanostructures. More particularly, this disclosure relates to the production of silver nanostructures.

BRIEF DESCRIPTION OF THE DRAWINGS

Understanding that drawings depict only typical embodiments of the invention and are not therefore to be considered to be limiting of its scope, the invention will be described and explained with specificity and detail through the use of the accompanying drawings as listed below.

DETAILED DESCRIPTION

Figure 1:
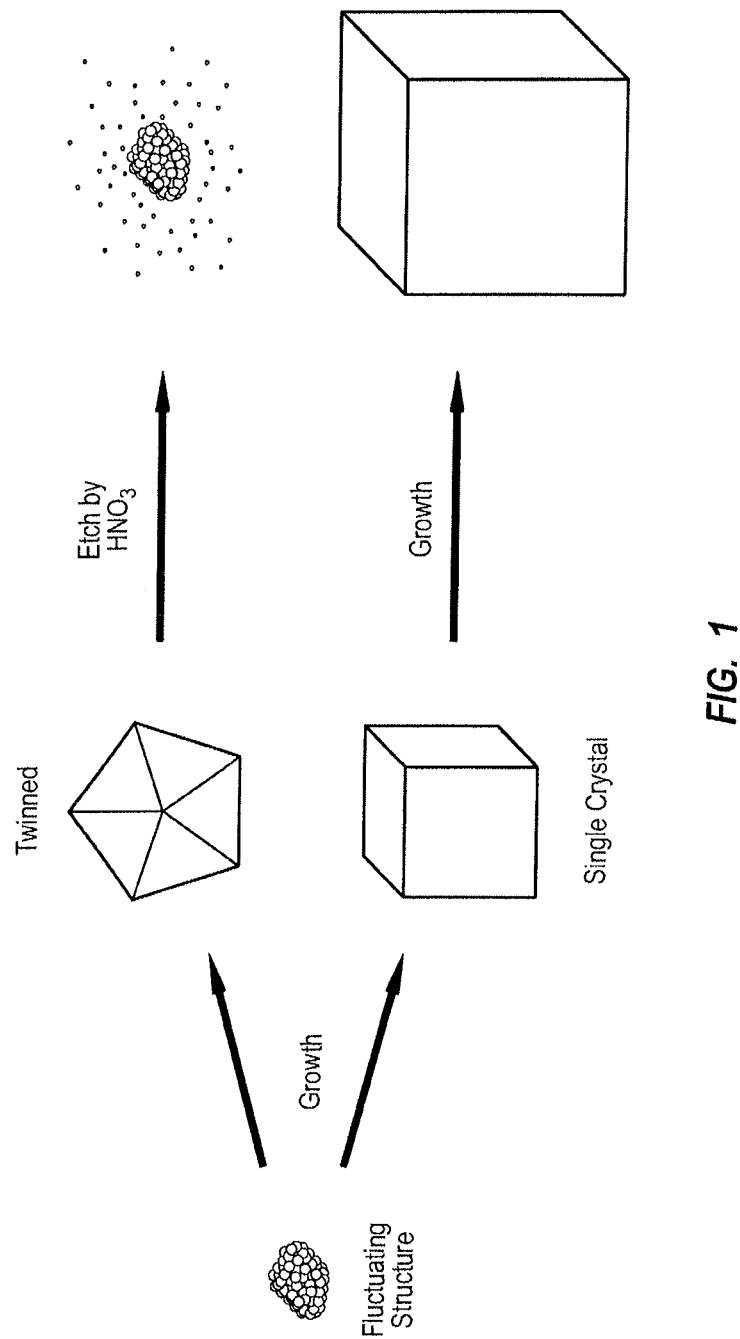
FIG. 1 is schematic illustration of the mechanism by which single-crystal silver nanocubes are produced.

It will be readily understood that the components and methods of the embodiments as generally described and illustrated in the figures herein could be arranged and designed in a wide variety of different configurations. Thus, the following more detailed description of various embodiments, as represented in the figures, is not intended to limit the scope of the invention, as claimed, but is merely representative of various embodiments. While the various aspects of the embodiments are presented in drawings, the drawings are not necessarily drawn to scale unless specifically indicated.

Shape control of metal nanoparticles has received considerable attention in recent years because of the strong correlation between the shape and the chemical, physical, electronic, optical, magnetic, and catalytic properties of a nanoparticle. Silver and gold, in particular, have been intensively studied due to their numerous applications that may include surface plasmonics, surface-enhanced Raman scattering (SERS), as well as chemical and biological sensing. A wealth of chemical methods have been developed for synthesizing silver and gold nanostructures having well-controlled shapes, and typical examples include triangular plates, cubes, belts, wires, rods, and branched multipods. Most of these methods, however, still require improvement in terms of yield, purity, monodispersity, and scale of synthesis before they will find use in commercial applications.

The polyol process is well known by those in the art as a means to synthesize silver and gold nanoparticles with controllable shapes in relatively large quantities. (See, e.g. Y. Sun, Y. Xia, Science 2002, 298, 2176; R. Jin, S. Egusa, N. F. Scherer, *J. Am. Chem. Soc.* 2004, 126, 9900; T. K. Sau, C. J. Murphy, *J. Am. Chem. Soc.* 2004, 126, 8648; F. Kim, S. Connor, H. Song, T. Kuykendall, P. Yang, *Angew. Chem. Int. Ed.* 2004, 43, 3673; Y. Sun, B. Mayers, Y. Xia, *Nano. Lett.* 2003, 5, 675; Y. Sun, B. Mayers, T. Herricks, Y. Xia, *Nano Lett.* 2003, 3, 955; Y. Sun, Y. Yin, B. Mayers, T. Herricks, Y. Xia, *Chem. Mater.* 2002, 14, 4736; and Y. Sun, B. Mayers, Y. Xia, *Adv. Mater.* 2003, 15, 641, each of which are incorporated in their entirety by reference herein). The following experimental examples disclose various embodiments of silver nanostructure production.

Example 1

It is known by those of skill in the art that single-crystal cubes and tetrahedrons of silver with truncated corners/edges may be prepared through the selective etching and dissolution of twinned seeds by chloride ions and oxygen (from air). In one possible embodiment hydrochloric acid may be used as a mediator for the production of single-crystal nanocubes.

In a typical polyol synthesis, silver atoms may be obtained by reducing AgNO$_3$ with ethylene glycol (EG) through the following reactions:

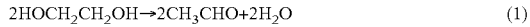

$$2HOCH_2CH_2OH \rightarrow 2CH_3CHO + 2H_2O \qquad (1)$$

$$2Ag^+ + 2CH_3CHO \rightarrow CH_3CHO\text{—}OHCCH_3 + 2Ag + 2H^+ \qquad (2)$$

Once the concentration of silver atoms has reached the supersaturation value, they may start to nucleate and grow into nanoparticles. At the same time, nitric acid generated in situ activates a backward reaction that dissolves the solid silver initially formed:

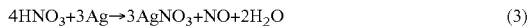

$$4HNO_3 + 3Ag \rightarrow 3AgNO_3 + NO + 2H_2O \qquad (3)$$

Through the introduction of HCl, reaction (3) can be driven further to the right due to the formation of more HNO$_3$ from HCl and AgNO$_3$.

On the basis of these reactions single-crystal silver nanocubes may be formed. Upon addition of silver nitrate and PVP to the hot EG solution, both twinned and single-crystal seeds of silver can be formed through homogeneous nucleation, with the twinned particles being the most abundant morphology as a result of their relatively lower surface energies. These initially formed nanoparticles are dissolved due to the relatively high concentration of HNO$_3$ present in the early stages of the reaction. As the reaction continues, HNO$_3$ is gradually consumed and a second round of nucleation occurs. At very small sizes the crystal structure of these nuclei may fluctuate. When the nanoparticles grow in dimension, they can be locked into either a single crystalline or twinned morphology. While the twinned particles have a lower overall surface energy, this comes at the expense of significant lattice distortion and surface defects. Thus, twinned particles are expected to exhibit a stronger reactivity and susceptibility towards etching. Since no lattice distortion is required to form a single crystal, these seeds should be relatively more stable in this environment, and can continue to grow. Consequently, through the selective etching of twinned seeds by $HNO_3$, high yields of single-crystal nanocubes result. FIG. 1 shows a schematic illustration summarizing this mechanism.

While selective etching is the dominant mechanism for producing nanocubes, there are additional elements that contribute to its success. In one embodiment of the present invention, both the proton and the chloride ion of HCl may play a significant role. In addition to its function in increasing the concentration of $HNO_3$, the proton can greatly reduce the net reaction rate according to Le Chatelier's principle. At the same time, chloride ions likely adsorb onto the surfaces of silver seeds, and thereby prevent agglomeration through electrostatic stabilization. In yet another embodiment, the reaction temperature may be reduced from 160° C. to 140° C. to further slow down the net reaction rate in an effort to increase the efficiency of selective etching by nitric acid. This combination of factors may promote the production of silver nanocubes at high yields and with monodispersed sizes.

Figure 2A:
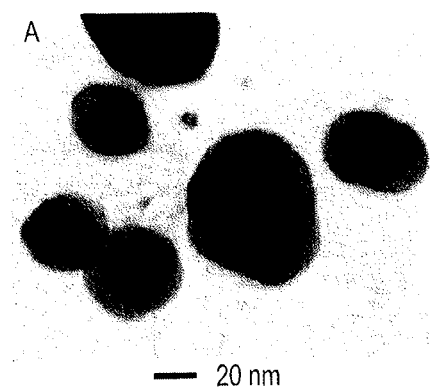
FIGS. 2A-2D are transmission electron microscope (TEM) images of silver nanoparticles produced at t=4 min (2A), 46 min (2B), 103 min (2C), and 15 h (2D).
Figure 2B:
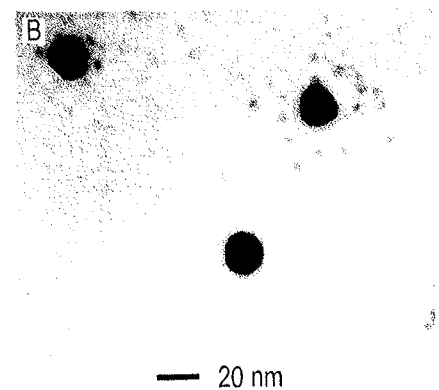
Figure 2C:
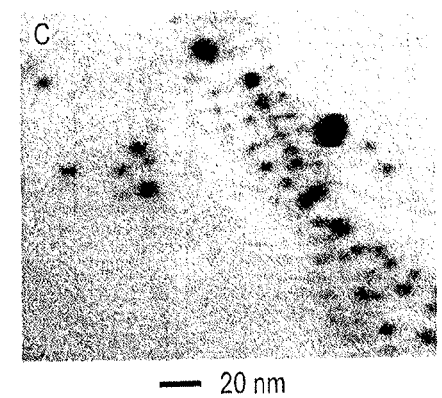

The primary stages of the reaction can be recognized by their distinctive colors (not shown). For example, the solution may progress from clear to milky white (up until t=4 min) after the injection of the $AgNO_3$ and PVP solutions. This color suggests the presence of AgCl precipitate due to the relatively high concentration of chloride ions in the reaction mixture (0.25 mM). FIG. 2A shows a TEM image of a sample taken from the solution at t=4 min. The chemical composition of these particles was AgCl, as confirmed by both XRD and EDX analyses. At t=45 min, the solution became light yellow in color (not shown), indicating that the AgCl particles had dissolved and only Ag nanoparticles remained in the reaction mixture. As shown by the TEM of FIG. 28, Ag nanoparticles of two different sizes (~17 and ~5 nm) coexisted in the solution at this time. The light yellowish color gradually faded, and the solution appeared transparent and colorless around t=105 min (not shown), suggesting the complete dissolution of all large Ag nanoparticles. This picture is also consistent with TEM observations shown by FIG. 2C where only very few Ag nanoparticles of very small size (~6 nm) could be found.

Figure 2D:
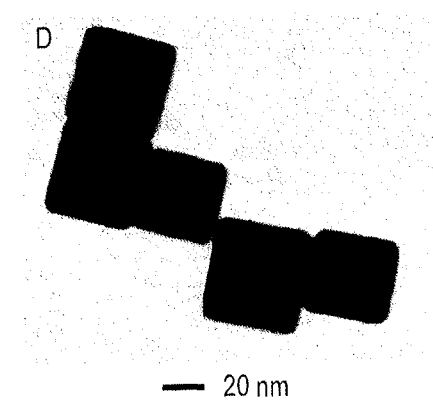
Figure 3:
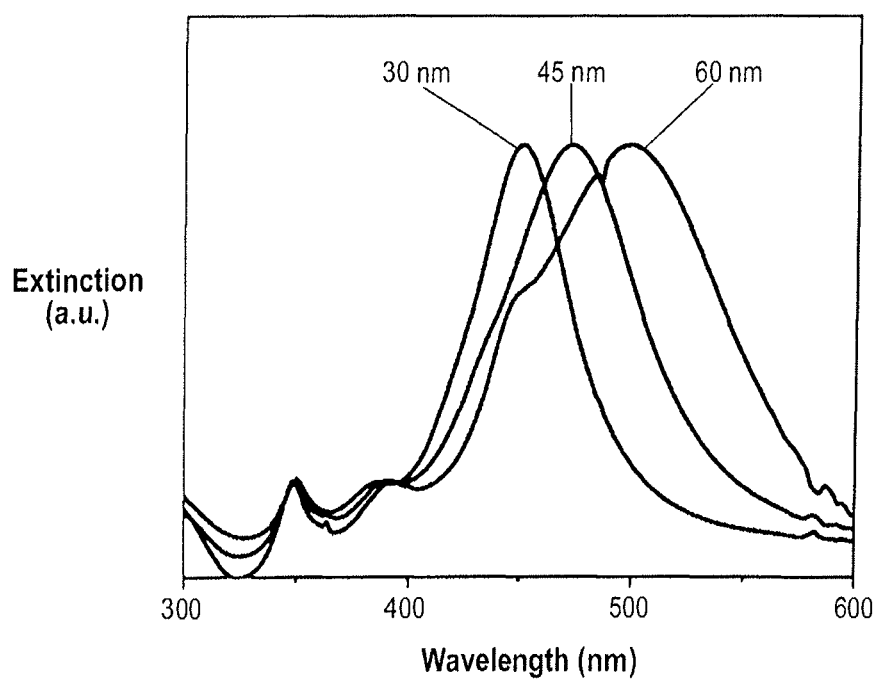
FIG. 3 UV-Visible extinction spectra take from aqueous solutions that contained silver nanocubes with different edge lengths (30, 45, and 60 nm).

This transparent state may lasted for approximately 1 hour, whereupon the solution acquired a reddish tint of increasing intensity over a period of several hours. By t=15 h, the solution had become indisputably red (not shown), implying the formation of small Ag nanocubes. Referring to the TEM image of FIG. 2D, the Ag nanocubes appear symmetrical in shape and ~30 nm in edge length. These Ag nanocubes could further grow into larger sizes if the reaction was allowed to continue. The solution became ocher in color at approximately t=26 h (not shown). The Ag nanocubes contained in this solution were also symmetrical in shape, with their edge length having increased to ~130 nm. This observation implies that it will be possible to control the size, and therefore the optical properties of Ag nanocubes, simply by varying reaction time. FIG. 3 shows the size-dependent extinction spectra of the cubes. The number of peaks and relative positions are consistent with theoretical calculations.

Figure 4A:
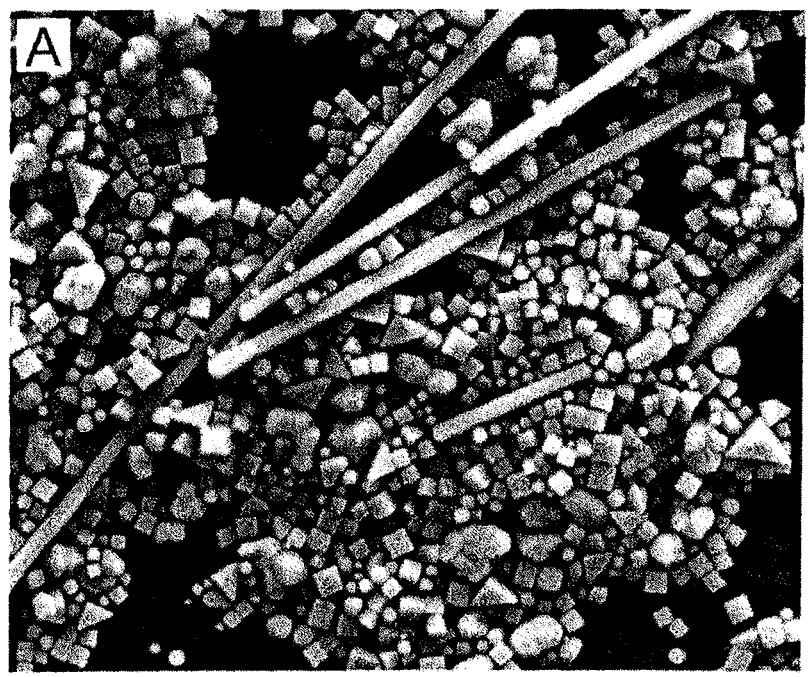
FIGS. 4A-4D are scanning electron microscope (SEM) images of silver nanoparticles synthesized at different HCl concentrations: (4A) 0.125, (4B) 0.25, and, (4C) 0.375 mM, respectively. The reaction solution contained 23.5 mM of $AgNO_3$ and 36.7 mM of PVP (calculated in terms of the repeating unit), and was heated in an oil bath held at 140° C. (D) Silver nanoparticles obtained under the same condition except that the 0.25 mM HCl was replaced with 0.25 mM $HNO_3$.
Figure 4B:
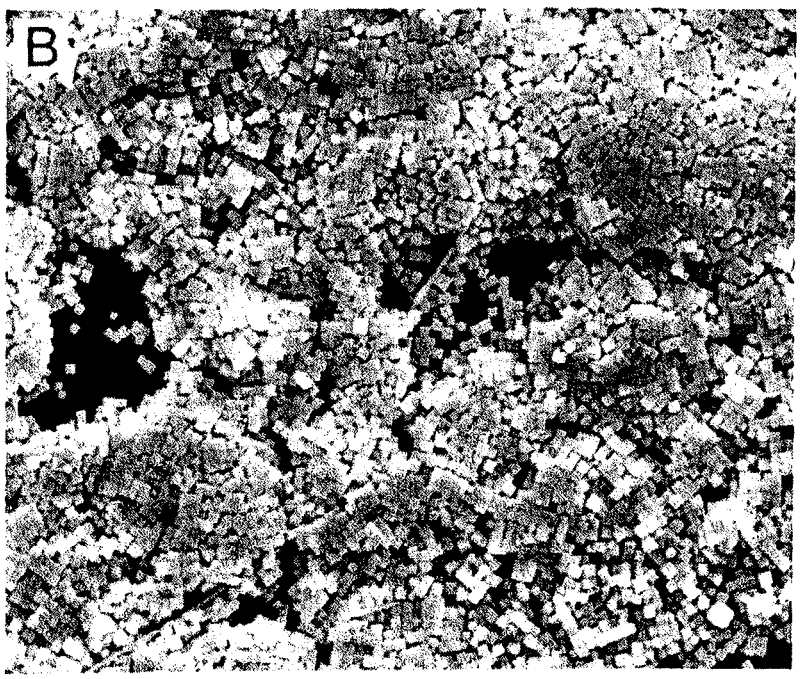
Figure 4C:
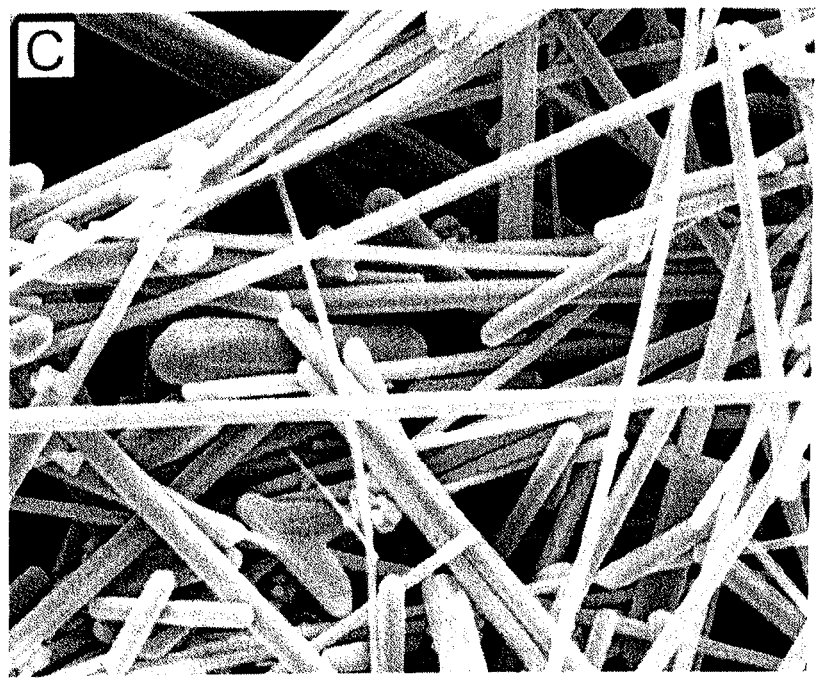

In yet another embodiment, the dependence of morphology on the concentration of HCl was also examined. FIG. 4A shows the SEM image of a product obtained at t=25 h when the concentration of HCl in the final mixture was 0.125 mM. This sample contained a mixture of polydisperse silver nanocubes, tetrahedrons, and nanowires. It is believed that the wires and irregular particles formed due to the incomplete etching of twinned seeds by the lower concentration of $HNO_3$. FIG. 4B shows an SEM image of the final product obtained at t=26 h when the concentration of HCl was increased to 0.25 mM (i.e., the synthesis described in FIGS. 2A-2D). The solution contained only monodisperse silver nanocubes of ~130 nm in edge length. As the concentration of HCl was further increased to 0.375 mM, a different morphology was observed (FIG. 4C). This product, obtained at t=22 h, was characterized by a mixture of relatively thick wires and irregular particles. In this case, it was found that the reaction mixture did not become transparent, indicating that the twinned seeds were not dissolved to cut short their growth into nanowires and irregular particles. The chloride ions may slow down the etching of twinned seeds by selectively blocking the twin sites through surface adsorption. Alternatively, it is possible that an increase in the HCl concentration may result in the formation of more AgCl precipitate at the initial stage of a synthesis, and that some of these AgCl colloids may survive and serve as seeds for the subsequent growth of twinned particles.

Figure 4D:
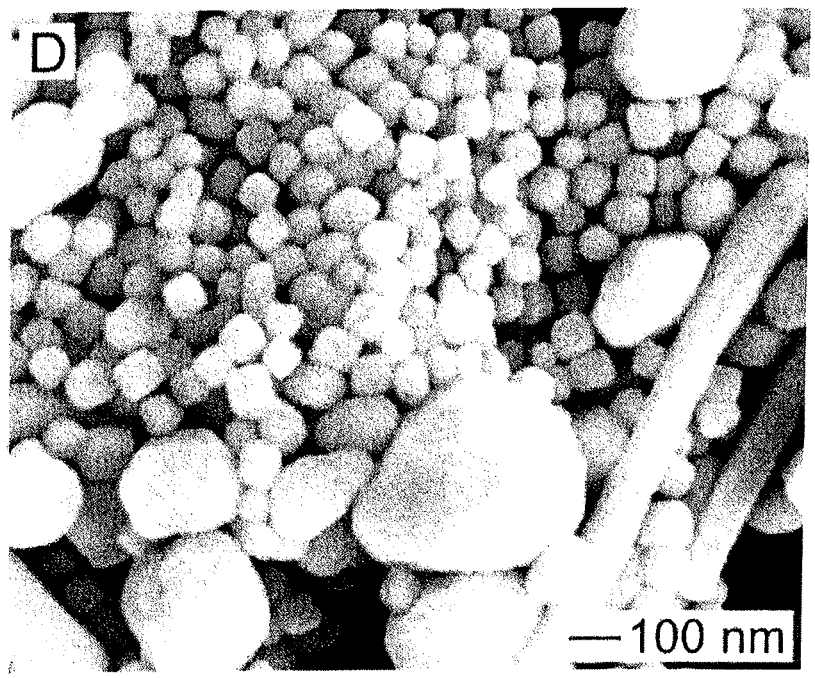

In order to separate the roles played by the proton and chloride, the 0.25 mM HCl was replaced with 0.25 mM $HNO_3$. The $NO_3-$ ions from $HNO_3$ should have a negligible effect on the synthesis because the concentration of $HNO_3$ was extremely low as compared to the concentration of $AgNO_3$. FIG. 4D shows a SEM image of the product at t=30 h, which contained a mixture of small silver nanocubes (~40 nm in edge length) and some irregular particles. This observation implies that $HNO_3$ may be able to induce the etching and dissolution of twinned seeds, and thus channel the product into single crystal nanocubes. However, due to the absence of Cl— in the solution, the single-crystal seeds could not be stabilized, and therefore might agglomerate into larger, irregularly shaped particles. It is also expected that a combination of Cl– and $O_2$ will facilitate the etching and dissolution of twinned seeds to further reduce the percentage of twinned particles in the final product.

Figure 5A:
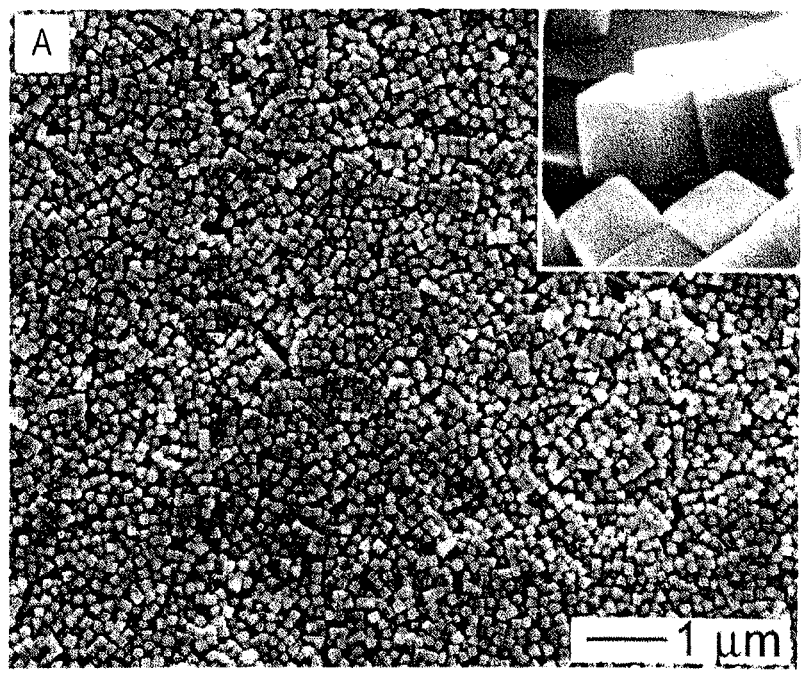
FIGS. 5A-5C are Typical SEM images of the as-synthesized silver nanocubes. The 5A inset is an SEM image illustrating the sharp corners and edges of these nanocubes. (5B) An X-ray diffraction (XRD) pattern of the same batch of silver nanocubes. (5C) is a TEM image of silver nanocubes. The inset gives an electron diffraction pattern recorded by directing the electron beam perpendicular to the (100) facet of a silver nanocube.
Figure 5B:
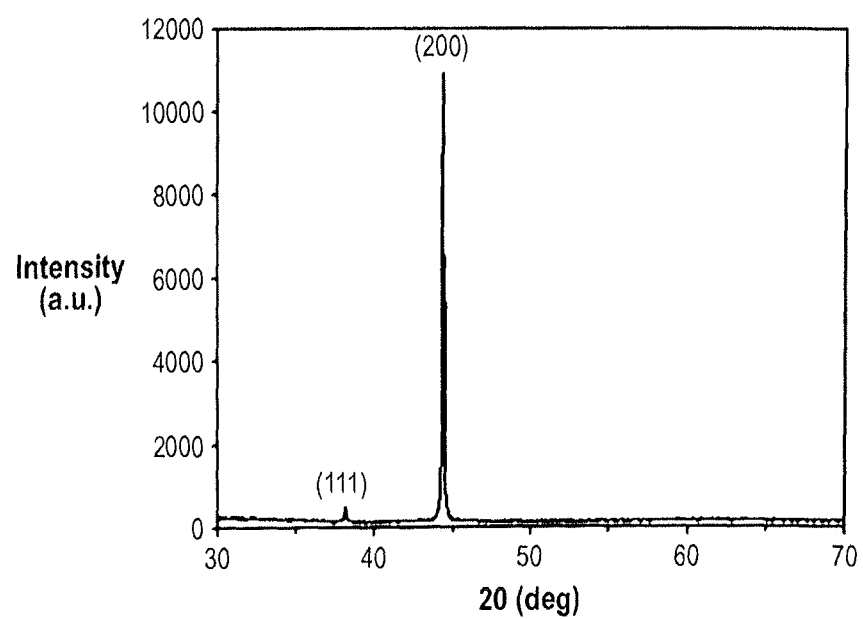
Figure 5C:
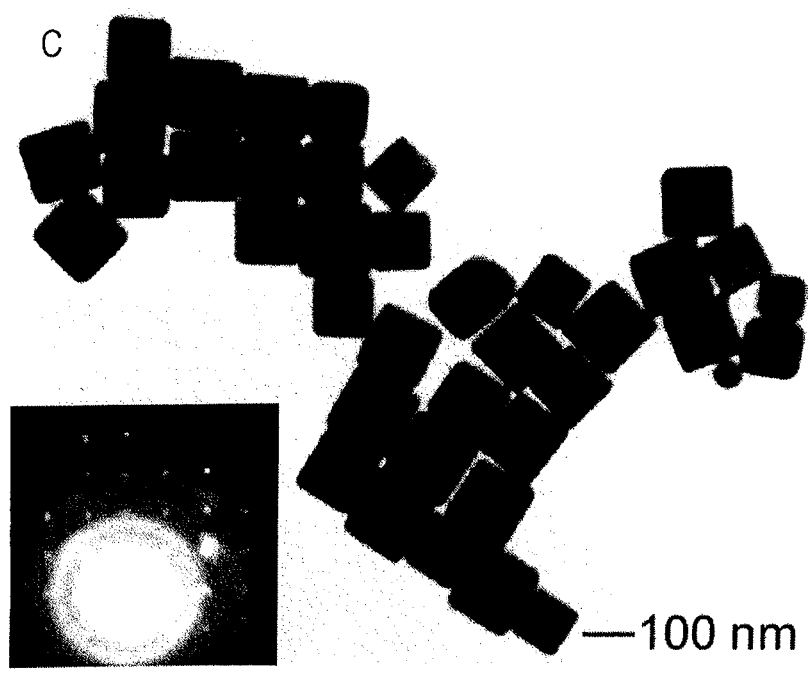

In yet another embodiment, volumes of all the solutions were multiplied by five times. In this case, the synthesis followed the same pattern of color changes, suggesting the nucleation and growth mechanisms did not change as the reaction volume was increased. FIG. 5A shows a SEM image of this sample, indicating that all particles were cubic in shape with an average edge length of 125 nm. The inset is a tilted SEM image at higher magnification, which clearly displays the sharp corners and edges of these nanocubes. FIG. 5b shows an XRD pattern recorded from the same batch of silver nanocubes. The abnormal intensity of the (200) peak may suggest that the sample is made of nanocubes that were preferentially oriented with their (100) planes parallel to the supporting substrate. FIG. 5C shows a typical TEM image of the silver nanocubes. The inset shows an electron diffraction pattern recorded by directing the electron beam perpendicular to the (100) facet of an individual nanocube, confirming that the particles are single crystals.

In summary, monodispersed nanocubes of silver have been synthesized in large quantities by introducing a small amount of hydrochloric acid to the conventional polyol synthesis. Based on color changes and electron microscopy studies, it is believed that hydrochloric acid plays an important role in selectively etching and dissolving twinned silver nanoparticles. In addition, the presence of protons may slows down the reduction reaction, and thereby facilitate the formation of single-crystal seeds.

Experimental

In a polyol synthesis, 5 mL of ethylene glycol (EG, J. T. Baker, 9300-01) was placed in a 20-mL vial, capped, and heated in an oil bath at 140° C. for 1 h. Thereafter, 1 mL of a 3 mM HCl solution in EG was quickly added, and the vial was recapped. After 10 min, 3 mL of an EG solution of AgNO3 (94 mM, Aldrich, 209139-100G) and 3 mL of an EG solution of poly(vinyl pyrrolidone) (PVP, M.W.≈55,000, Aldrich, 856568-100G, 147 mM in terms of the repeating unit) were simultaneously added with a two-channel syringe pump (KDS-200, Stoelting, Wood Dale, Ill.) at a rate of 45 mL per hour. The vial was then capped and heated at 140° C. Magnetic stirring was applied throughout the synthesis. Upon injection of the AgNO$_3$ solution, the reaction mixture went through a series of colors that included milky white, light yellow, transparent, red, and ocher. In order to separate the roles of the proton and chloride, a synthesis was performed under the same conditions except the substitution of HCl by HNO$_3$. For the scale-up synthesis, the vial was replaced with a 100-mL flask and the volumes of all solutions were increased by five times.

Silver nanostructure samples that were isolated for morphology and structure analysis were washed with acetone and then with water to remove excess EG and PVP. SEM images were taken using a field emission scanning electron microscope (FEI, Sirion XL) operated at an accelerating voltage of 10-20 kV. The transmission electron microscopy (TEM) images and diffraction patterns were obtained using a JEOL microscope (1200EX II) operated at 80 kV. X-ray diffraction (XRD) studies were performed on a Philips-1820 diffractometer with a scanning rate of 0.2 degrees per minute in the range of 20 to 90 degrees. UV-visible extinction spectra were taken at room temperature on a Hewlett-Packard 8452 spectrometer (Palo Alto, Calif.) using a quartz cuvette with an optical path of 1 cm.

Example 2

The properties and applications of metallic nanostructures depend on their shapes. For silver nanostructures, shape control enables optimization of the surface plasmon resonance (SPR) features, and of the local electric field strength for chemical sensing or surface-enhanced Raman scattering (SERS). The loading of silver required in thermally and electrically conductive polymer composites can also be greatly reduced if the silver flakes typically employed are replaced with nanorods of high aspect-ratios. Furthermore, silver nanowires hold great promise as interconnects and sensors in nanoscale devices due to their extremely high electrical conductivity and chemical sensitivity.

Since a quasi-spherical nanoparticle has the lowest possible surface energy and is therefore favored by thermodynamics, the growth kinetics of a seed must be carefully controlled to obtain a shape that does not represent an energy minimum. Factors that influence the growth kinetics of a solution-phase synthesis include: i) the concentration of metal precursor; ii) the rate of reduction (the concentration and power of reductant); iii) the presence of a soft template or capping agent; and iv) the specific adsorption of a capping agent to a particular crystallographic plane. Those of skill in the art have employed such kinetic controls to generate triangular and circular nanoplates of silver in a number of different solvent systems. In the polyol synthesis, silver nanocubes, nanowires, and quasi-spheres have been obtained by controlling the ratio of the capping agent, poly(vinyl pyrrolidone) (PVP), to the silver precursor, AgNO$_3$. Specific adsorption of PVP to the {100} facets of the seeds governed their growth into either nanocubes (for single-crystal seeds) or nanowires (for multiply twinned seeds with a decahedral shape). Higher concentrations of PVP resulted in isotropic coverage of the seed surface and the formation of quasi-spherical particles.

It has been shown that etching of silver by O$_2$/Cl— selectively removed the twinned seeds involved in the polyol synthesis of silver nanostructures. Such etching resulted in high yields of monodispersed single-crystal seeds that grew to form truncated nanocubes and tetrahedra. Because the concentration of O$_2$ in ethylene glycol is difficult to control, it would be advantageous to have other etchants of silver that could be added to the reaction in a controllable fashion. Fe(III) is a well-established wet etchant for silver and other noble metals. In a recent demonstration, addition of Fe(III) to the polyol reduction of H$_2$PtCl$_4$ at 110° C. reduced the level of supersaturation by oxidizing Pt(0) atoms back into Pt(II). This led to slow growth during which Pt atoms preferentially added to {111} facets, resulting in uniform Pt nanowires as the final product.

In an embodiment of the present invention, Fe(III) may be used as an oxidative etchant to the polyol synthesis of silver nanostructures. Contrary to the synthesis of platinum nanowires, addition of Fe(III) to the polyol synthesis of silver nanostructures consistently accelerated the rate of reduction. Further, the function of Fe(III) was similar to that of Fe(II), and both produced results that were concentration dependent. At approximately 2.2 µM, uniform nanowires with pentagonal cross-sections were obtained as the product. At <0.44 µM, high yields of single-crystal nanocubes were produced in about ⅕ the time previously required. By simply adjusting the concentration of Fe(II) or Fe(III), it was possible to obtain pure nanocubes or nanowires.

Figure 7A:
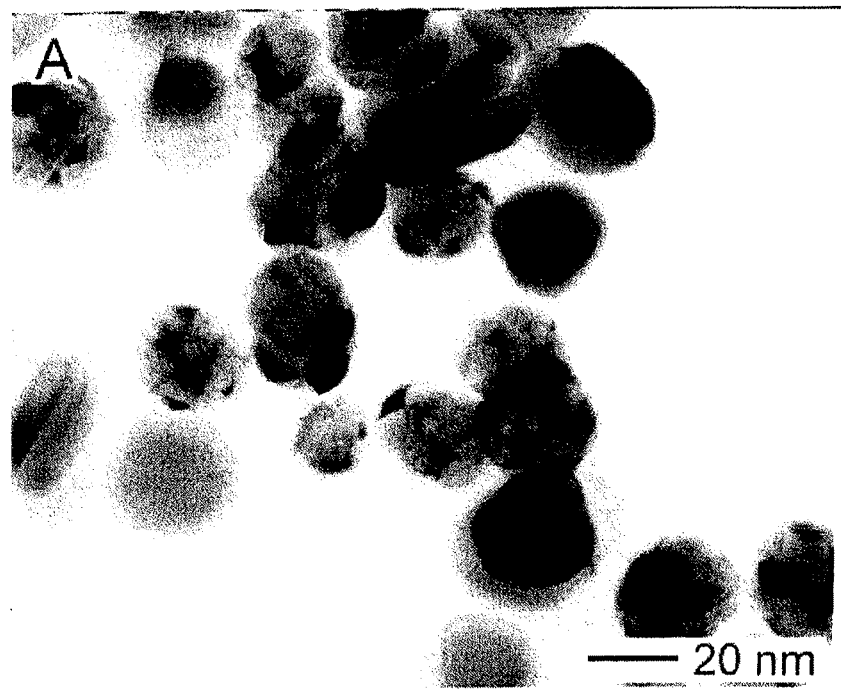
FIGS. 7A-7B show TEM (7A) and SEM (7B) images of samples taken from reactions at t=10 and t=60 min, respectively. The reaction solution contained 2.2 μM of $Fe(acac)_3$.
Figure 7B:
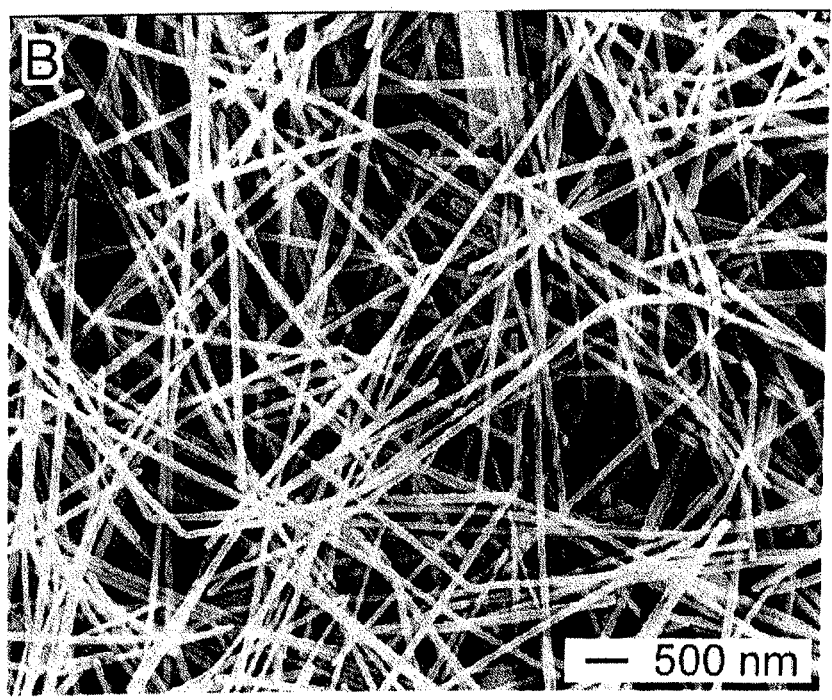
Figure 7C:
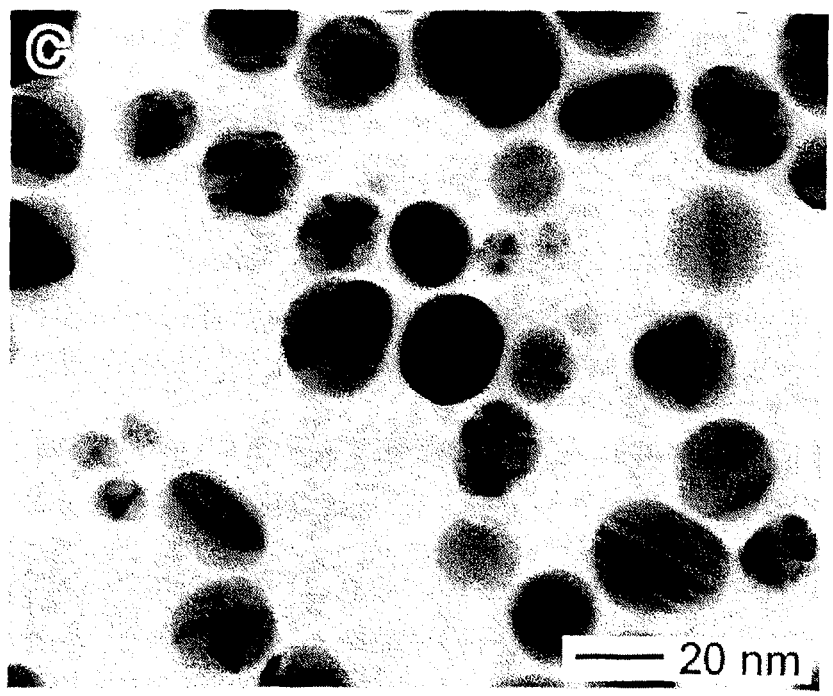
FIGS. 7C-7D show TEM (7C) and SEM (7D) images of samples taken from reactions at t=10 and t=60 min, respectively. The reaction solution contained 2.2 μM of $Fe(NO_3)_3$.
Figure 7D:
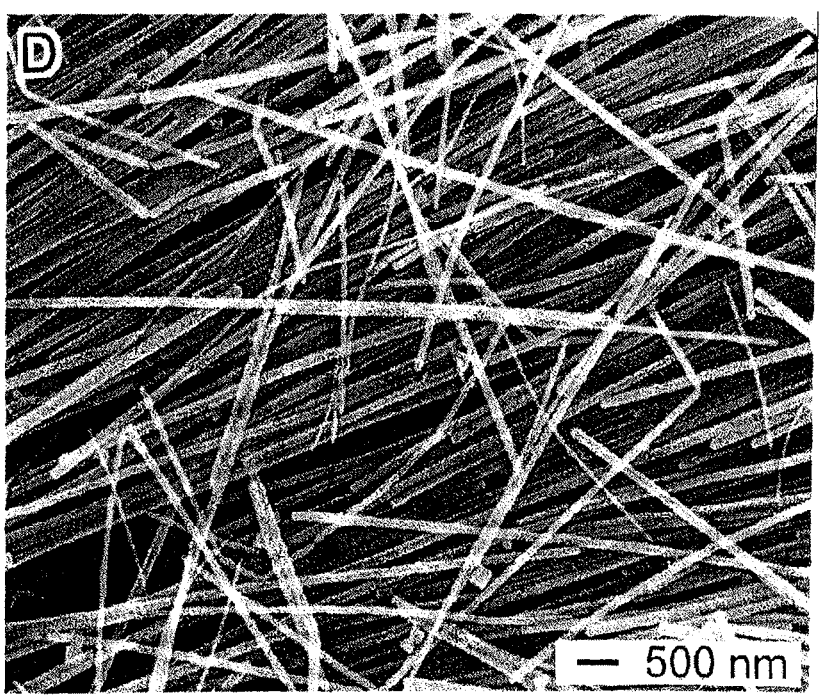

FIG. 7A shows TEM and FIG. 7B shows SEM images of samples taken from a polyol synthesis to which 0.06 mM of NaCl and 2.2 µM of Fe(acac)$_3$ were added. Fe(acac)$_3$ instead of FeCl$_3$ may be use so that the concentration of iron can be changed independently from the concentration of chloride. At 10 min (FIG. 7A), the majority of the nanoparticles were twinned. These twinned particles then grew into nanowires tens of micrometers long by t=60 min (FIG. 7B). Previously, when the same reaction was performed without addition of Fe(II), twinned silver nanoparticles that formed by 10 min were etched by oxygen in a matter of hours. Instead of accelerating the etching of silver, addition of Fe(III) seemed to prevent the etching process entirely. To confirm that the (acac)-anion played no role in this synthesis, Fe(acac)$_3$ was replaced with Fe(NO$_3$)$_3$. Again, the twinned particles present at t=10 min (FIG. 7C) grew into nanowires by t=60 min (FIG. 7D).

Figure 6:
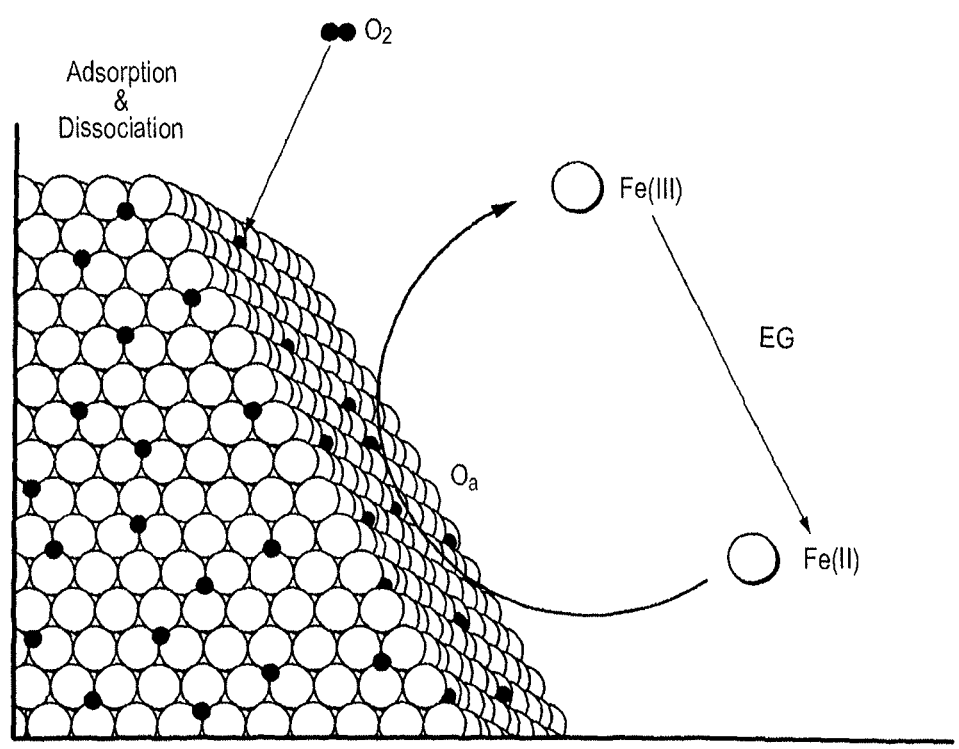
FIG. 6 is an illustration of the mechanism by which Fe(II) removes atomic oxygen from the surface of silver nanostructures. Reduction by ethylene glycol (EG) competes with oxidation by atomic oxygen to form an equilibrium between Fe(III) and Fe(II).

The different behaviors of Fe(III) in the polyol syntheses of platinum and silver nanostructures may be due to the difference in reaction temperature: 110° C. for platinum versus 148'C for silver. It has been shown that metals which are difficult to reduce by ethylene glycol at low temperatures can be reduced if the temperature is raised. Thus, the higher reaction temperature in the silver synthesis may reduce Fe(III) to Fe(II). As Fe(II) cannot oxidize silver, this would explain why addition of Fe(III) does not result in faster etching of twinned seeds. However, it does not explain why addition of Fe(III) prevented oxygen from etching silver nanoparticles. Interestingly, nanowires at high yields were also obtained when the same reaction was performed under argon without adding Fe(III). Between ~200 K and ~500 K, molecular oxygen ($O_2$) is known to adsorb and dissociate to atomic oxygen (Oa) on a silver surface, contributing to silver's function in the catalytic oxidation of methanol to aldehyde, ethylene to ethylene oxide, as well as its effectiveness as a bactericide. As nanowires could be produced either in the absence of oxygen, or in the presence of oxygen and iron ions, it is likely that Fe(II) reacted with and removed the adsorbed atomic oxygen that would otherwise etch twinned seeds, and block self-catalytic addition of silver atoms. The proposed reaction mechanism is illustrated in FIG. 6.

Figure 8A:
FIGS. 8A-8F show TEM (left) and SEM (right) images of samples taken from reactions at t=10 min, and t=60 min, respectively. Each solution contained (8A, 8B) 2.2, (8C, 8D) 22, and (8E, 8F) 220 μM of $Fe(acac)_2$. The inset in (F) shows the etched sample at higher magnification.
Figure 8B:
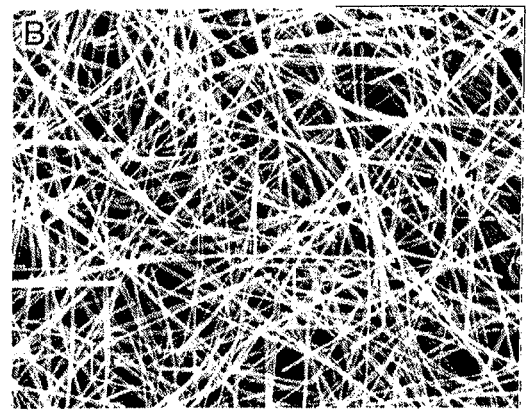
Figure 8C:
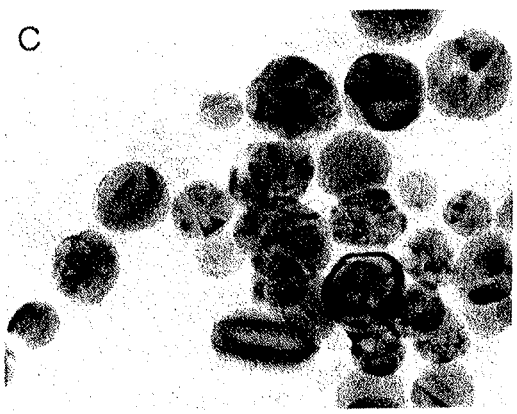
Figure 8D:
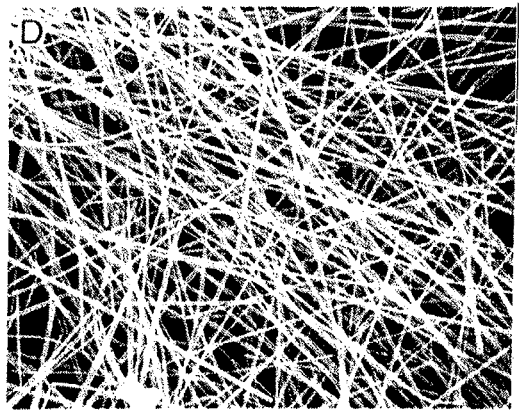

The same reaction with $Fe(acac)_2$ in place of $Fe(acac)_3$ produced twinned nanoparticles at 10 min (FIG. 8A) and nanowires by 60 min (FIG. 8B). When the concentration of $Fe(acac)_2$ was increased by another ten times to 22 μM, nearly the same result was obtained: the mixture of twinned and single-crystal nanoparticles present at the early stage (t=10 min) of the reaction had an average diameter of ~25 nm (FIG. 8C), and a high yield of nanowires was observed at t=60 min (FIG. 8D).

Figure 8E:
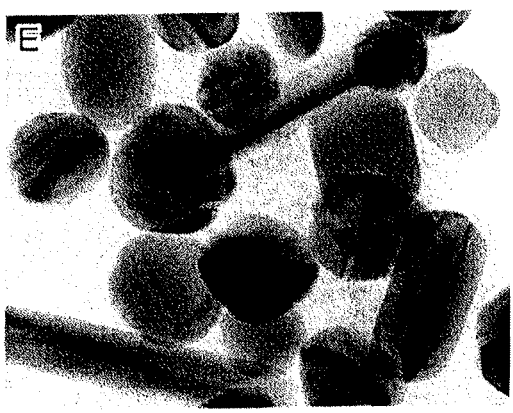
Figure 8F:
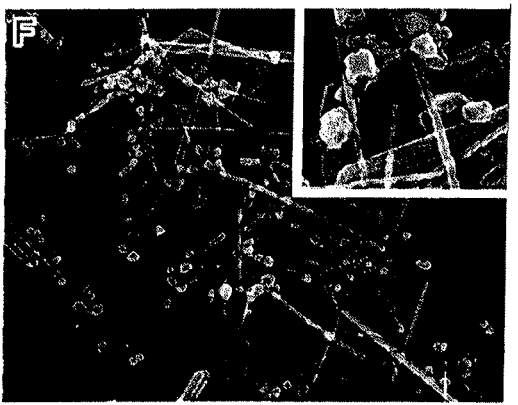

When the concentration of $Fe(acac)_2$ was increased again by ten times to 220 μM, the particles present in a sample taken at t=10 min were larger in size (FIG. 8E). FIG. 8F shows that, rather than producing nanowires, this reaction produced a mix of irregular particles and rods with rough surfaces that appeared to be etched. It is possible that the relatively large amount of Fe(II) in the reaction solution (resulting from the oxidation of Fe(II) by Oa, see FIG. 6) etched these silver nanostructures. This hypothesis is supported by the observation that no etching was observed when the same reaction was performed under argon. Without oxygen, Fe(II) could not be oxidized to Fe(III) and no etching took place.

Figure 9A:
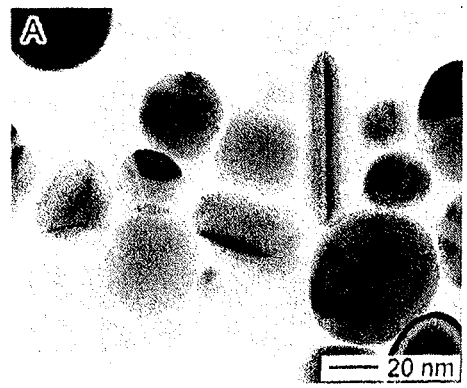
FIGS. 9A-9D show TEM images of samples taken from the reaction solution at different times: (9A) 10 min, (9B) 2 h, (9C) 6 h, and (9D) 8.5 h. The reaction solution contained 0.44 μM $Fe(acac)_2$.
Figure 9B:
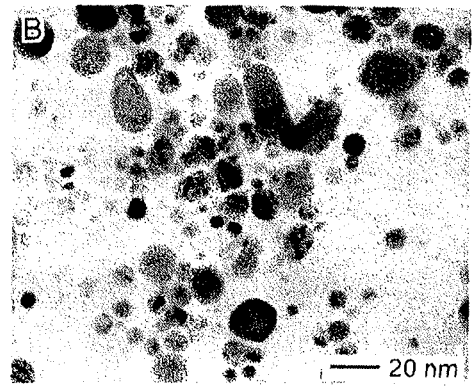
Figure 9C:
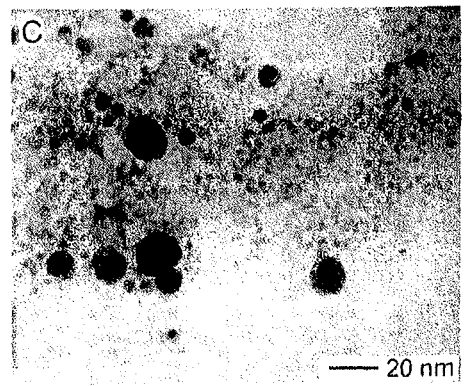
Figure 9D:
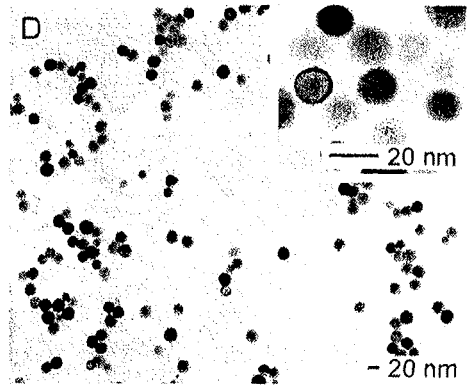
Figure 9E:
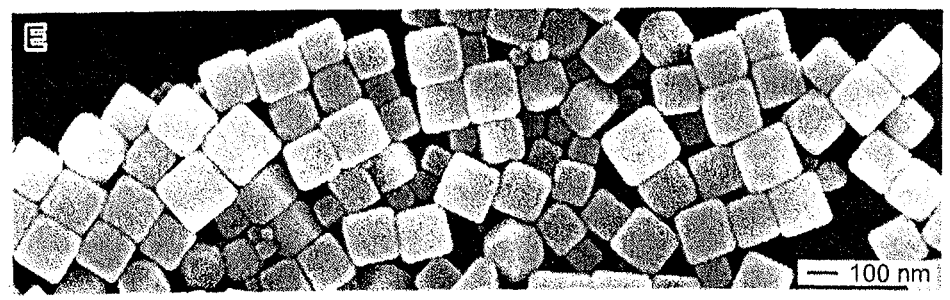
FIG. 9E shows an SEM image of isolated nanocubes taken at t=15 h. The reaction solution contained 0.44 μM $Fe(acac)_2$.

In yet another embodiment, the ability of Fe(III) to remove oxygen may provide a means to control the oxidative etching of silver. FIGS. 9A-9D show TEM images and FIG. 9E shows a SEM images of samples taken from a synthesis to which 0.06 mM NaCl and 0.44 μM $Fe(acac)_2$ were added. At t=10 min (FIG. 9A), both twinned and single-crystal nanoparticles were present. By t=2 h (FIG. 9B), etching by the Cl—/$O_2$ pair had plainly reduced the average particle size. As etching continued to t=6 h (FIG. 9O), the average particle size continued to decrease from ~10 nm to ~5 nm. In the TEM image of this sample, it appeared that there were a large number of very small particles (~3 nm), albeit the resolution limit of the microscope did not allow us to clearly resolve them. The structure of these small particles might fluctuate at the reaction temperature (148° C.) until they grew to larger sizes and became locked into either a single crystalline or twinned morphology. Cl—/$O_2$ would then preferentially etch twinned particles due to the higher density of defects on their surfaces. This selective etching is responsible for the high yield of single-crystal nanoparticles obtained at t=8.5 h (FIG. 9D). Such single-crystal nanoparticles could subsequently grow to form truncated nanocubes (FIG. 9E), whose average size was mainly controlled by the reaction time. The corner and edge truncation on these nanocubes relative to those produced by $O_2$/$Cl^-$ etching (but without the addition of Fe(II)) was reduced, likely due to their faster growth rate, and thus a kinetically favored shape. The faster growth of silver seeds in this new protocol may be due to removal of adsorbed oxygen from active surface sites. This polyol synthesis illustrates that addition of a small amount of Fe(II) mitigated the effect of oxidation such that selective etching of twinned particles still occurred, but the formation and growth of single-crystal nanocubes took place over a much shorter period of time (8.5 h versus 44 h).

Varying the concentration of iron ions, nanocubes or nanowires can be obtained with the same synthetic procedure. Polyol reduction maintained the iron species in the reduced, Fe(II) form, which in turned removed oxygen from the surface of seeds. At relatively low concentrations of Fe(II) or Fe(III), oxygen was partially removed, and high yields of single-crystal nanocubes were produced in about ⅕ the time previously required. Higher concentrations of iron species prevented selective oxidation of twinned seeds, which rapidly grew to form nanowires.

Experimental

In a polyol synthesis, 5 mL ethylene glycol (EG, J. T. Baker, 9300-01) was first immersed and then heated in an oil bath set at 160° C. for 10 min under a light nitrogen flow. This was done to quickly remove water. Heating was continued under air for another 50 min. A syringe pump (KDS-200, Stoelting, Wood Dale, Ill.) then regulated the simultaneous injection of two 3-mL EG solutions into the hot EG at a rate of 45 mL per hour. One of the solutions contained 94 mM silver nitrate (Aldrich, 209139-100G), and the other contained 144 mM poly(vinyl pyrrolidone) (PVP, Mw-55,000, Aldrich, 856568-100G, the concentration was calculated in terms of the repeating unit), and 0.22 mM NaCl (Fisher, S271-500). A small amount of NaCl was added to each synthesis to prevent aggregation of seeds. Varying concentrations of iron compounds were also added to the PVP solution to analyze their effect on the synthesis. The ethylene glycol used for every experiment contained trace amounts of chloride (3 μM) and iron (0.4 μM). Magnetic stirring was applied throughout the entire synthesis. A set of samples were taken in the course of each synthesis using a glass pipette. To minimize temperature perturbations during sampling, the glass pipette was held just above the solution and preheated for 30 sec before immersion. The samples were washed with acetone and then with water to remove most of the EG and PVP. During the washing process, the suspension was centrifuged at 16,000 rpm for 10 min or 30 min (depending on whether acetone or water was used) to make sure that most of the silver particles taken from the reaction were recovered. Finally, the sample was dispersed in water for further characterization.

For the scanning electron microscopy (SEM) and transmission electron microscopy (TEM) studies, a drop of the aqueous suspension of particles was placed on a piece of silicon wafer or carbon-coated copper grid (Ted Pella, Redding, Calif.), respectively, and dried in the fume hood. After that, the sample was transferred into a gravity-fed flow cell, and washed for 1 h with deionized water to remove the remaining PVP. Finally, the sample was dried and stored in a vacuum. SEM images were taken using a FEI field-emission microscope (Sirion XL) operated at an accelerating voltage of 20 kV. TEM and electron diffraction studies were performed with a Phillips 420 microscope operated at 120 kV.

Example 3

Plasmon excitation within a silver nanostructure not only gives it color in far-field imaging, but also greatly magnifies the electric field near its surface. This intense near-field has recently enabled nanoscale waveguiding and localization of light for nanolithography and optical devices, and has long been used to enhance the Raman scattering from adsorbed molecules. Theoretical calculations predict a 50-nm silver sphere provides a maximum electric field enhancement on the order of 102, but this can be improved 100-fold by a nanostructure with sharp corners, such as a tetrahedron. Indeed, the theoretical field enhancement provided by the sharp corners of a tetrahedron is on the same order of magnitude as the "hot spots" between nanoparticles thought to allow single-molecule surface enhanced Raman scattering (SERS) detection.

Another embodiment of the invention includes the synthesis of silver right bipyramids—nanoparticles with sharp corners similar to those of a tetrahedron. This remarkable shape, which is essentially two right tetrahedra symmetrically placed base-to-base, was proposed over 20 years ago by Harris in studying sulfur-induced faceting of platinum nanoparticles in the gas phase, but there have been no further reports, and it has never before been selectively produced in high yield.

Figure 13:
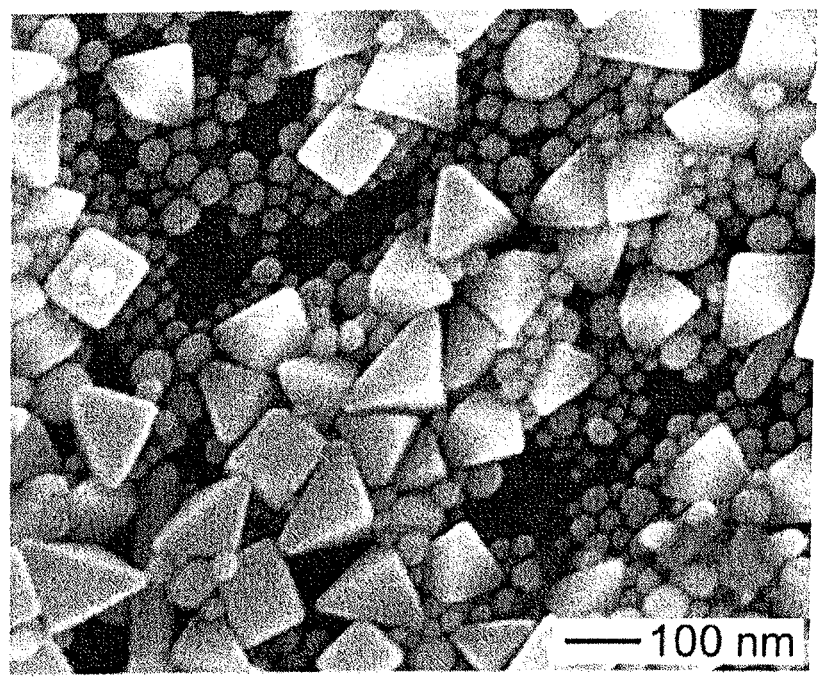
FIG. 13 shows a SEM of isolated nanostructures at t=5 hours when NaBr was not added to the preheated EG before the Ag precursor.

To synthesize right bipyramids, 3 ml of two EG solutions, one containing 94 mM $AgNO_3$, the other containing 144 mM poly(vinyl pyrrolidone) (PVP) and 0.11 mM NaBr, were added dropwise via a two channel syringe pump into 5 ml of EG heated in an oil bath at 160° C. A 30 μL drop of 10 mM NaBr was also added to the preheated EG before the Ag precursor, as this was found to prevent formation of small spherical nanoparticles that otherwise contaminated the final product, as shown in FIG. 13. The reaction solution turned yellow 30 seconds after addition of $AgNO_3$ and PVP, indicating the formation of silver nanoparticles. The yellow color faded in intensity after 10 minutes due to oxidative etching, 15 and maintained a light yellow color for approximately two hours before turning light brown and gray as the nanoparticles increased in size.

Figure 10A:
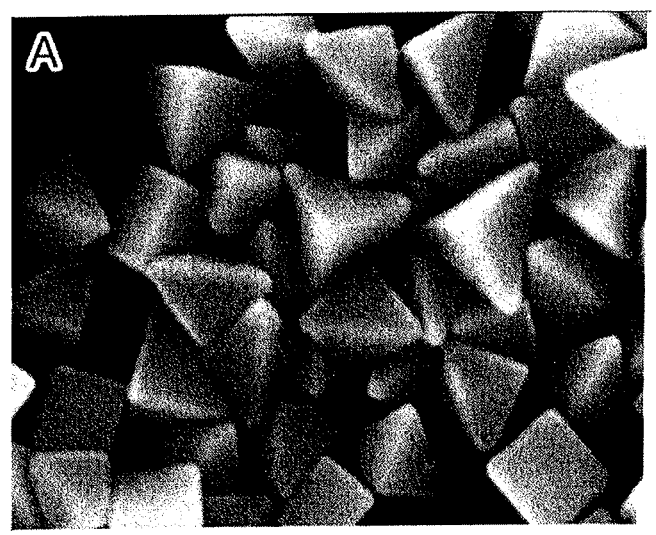
FIGS. 10A-10B show SEM images of bipyramids approximately (10A) 150 nm and (10B) 75 nm in edge length. The inset in (10B) shows the electron diffraction pattern obtained from a single bipyramid, indicating it may be bounded by (100) facets.
Figure 10B:
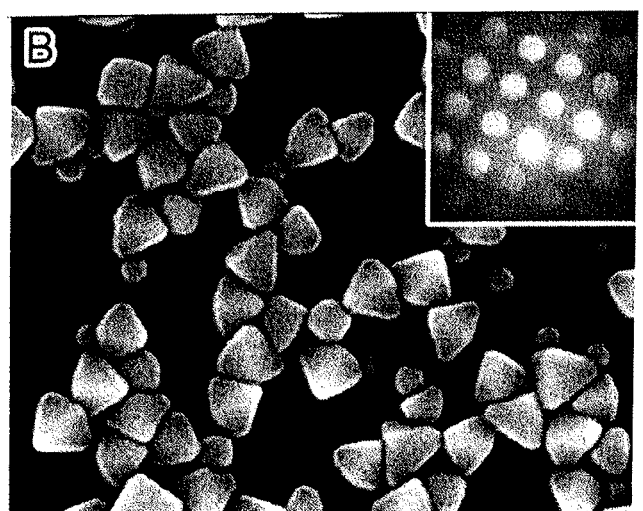
Figure 14:
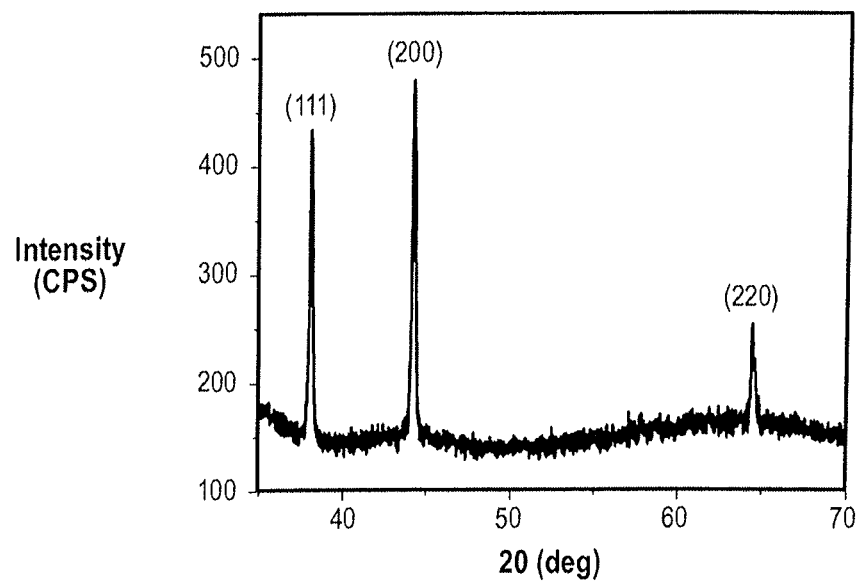
FIG. 14 shows a XRD pattern obtained from 150 nm right bipyramids on a glass slide.

FIG. 10A shows a SEM image of the right bipyramids obtained after 5 hours. Their average edge length was 150 nm, and their corners had an average radius of curvature R=11 nm. If the reaction was stopped after 3 hours, right bipyramids 75 nm in edge length were obtained as shown by FIG. 10B. Although the corners of the 75 nm right bipyramids appear less sharp, they were actually more so, with R=8 nm. The inset of FIG. 10B shows an electron diffraction pattern obtained from a single right bipyramid, with the beam perpendicular to the substrate. The spot array is characteristic of diffraction from the (100) zone axis, and indicates the bipyramid lies with a (100) facet flush with the substrate. Because every facet on the bipyramid is identical, it can be concluded that the bipyramid is bounded by (100) facets, similar to a single-crystal nanocube. The X-ray diffraction (XRD) pattern of FIG. 14 obtained from the right bipyramids gives further evidence that they preferentially orient with the (100) plane parallel to the substrate. The (111), (200), and (220) diffraction peaks in FIG. 14 are characteristic of face-centered-cubic silver, but the ratio of the (200) to (111) peak is three times that of a powder sample (1.2 versus 0.4). The relatively small contribution to diffraction from the (111) plane may come from the randomly oriented right bipyramids in multilayers as may be seen in FIG. 10A.

Figure 10C:
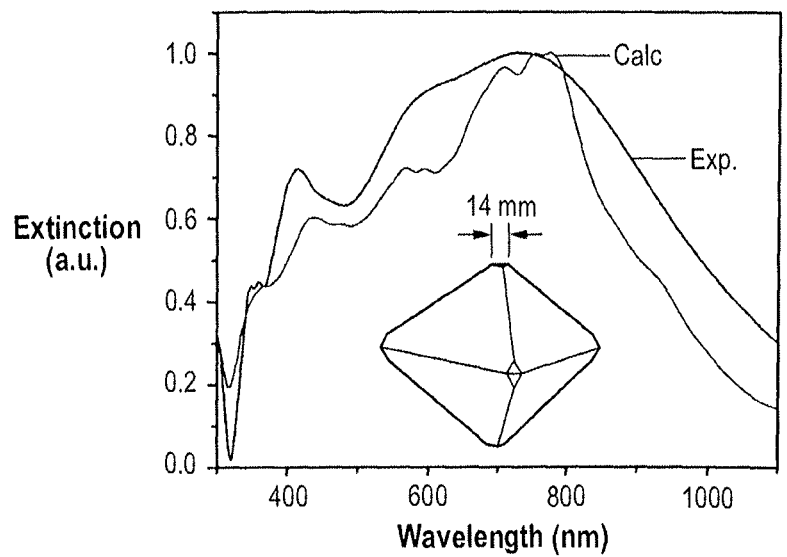
FIGS. 10C-10D show comparisons of the UV-Vis-NIR spectra taken from the bipyramids in FIGS. 10A and 10B with DDA calculations performed on bipyramids of the same size, but with corners truncated by (111) facets 14 and 12 nm in edge length, respectively.
Figure 10D:
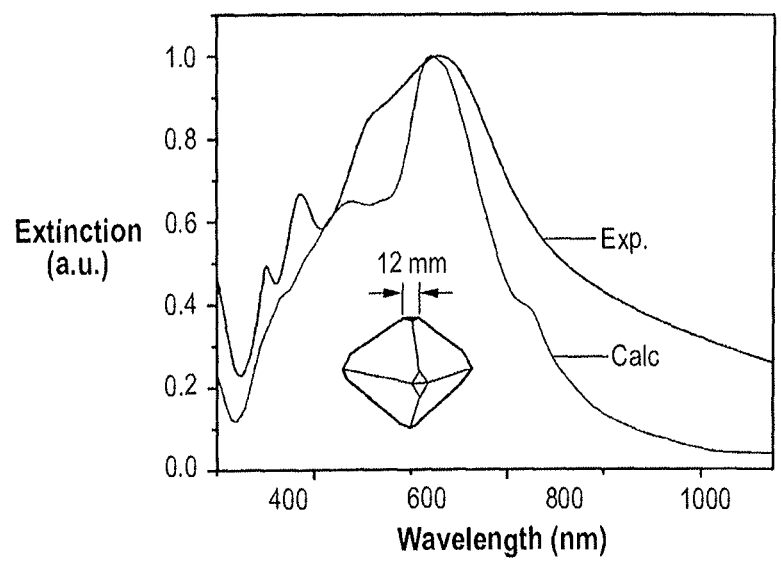
Figure 15A:
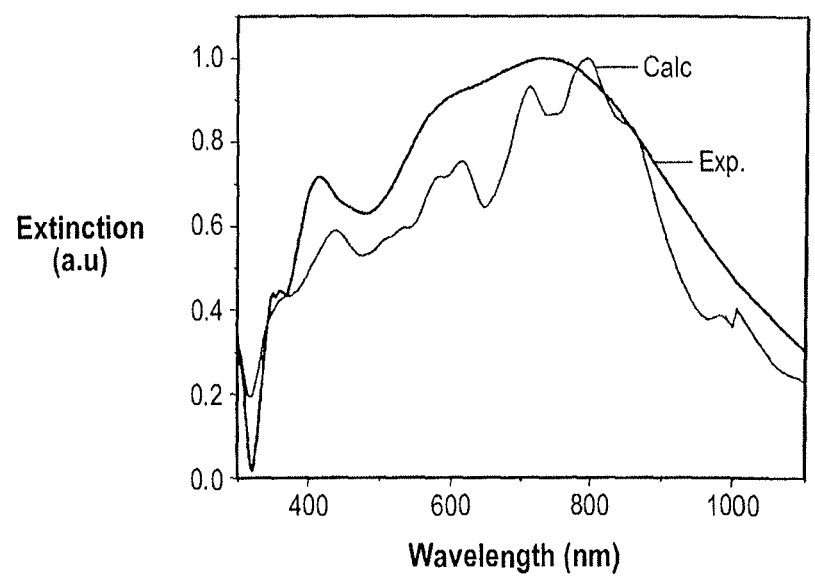
FIGS. 15A-15B show comparisons of the UV-Vis-NIR spectra taken from the bipyramids in FIGS. 10A and 10B with DDA calculations performed on right bipyramids 150 and 75 nm in edge length without any truncation.
Figure 15B:
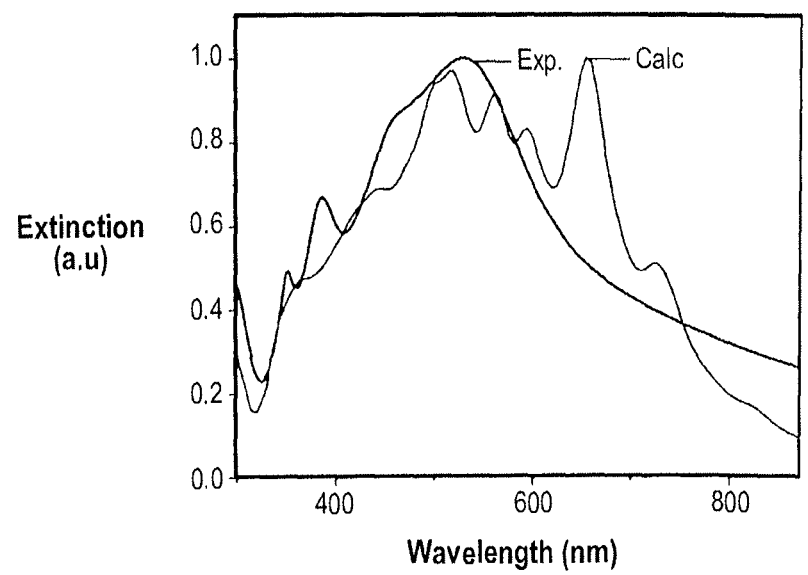

The unique shape of the right bipyramid gives it an ultra-violet-visible-near-infrared (UV-Vis-NIR) extinction spectrum distinct from that of any previously reported silver nanostructure. To determine if the experimental spectrum of the bipyramids agrees with the theoretically predicted one, Maxwell's equations were solved with the discrete dipole approximation (DDA) for bipyramids 150 nm and 75 nm in edge length, with each composed of 2600 dipoles. The spectrum calculated with a perfect bipyramid model has more peaks than the experimental spectrum, and the maximum peak is further red-shifted as seen in FIGS. 15A-15B. Better agreement between the experimental and calculated spectra was achieved when the corners of the 150- and 75-nm bipyramids were truncated with (111) facets 14 and 12 nm in edge length, respectively. As shown in FIGS. 10C and 10D, this truncation reduced the number of peaks and caused the most intense peaks to blue-shift.

Figure 16:
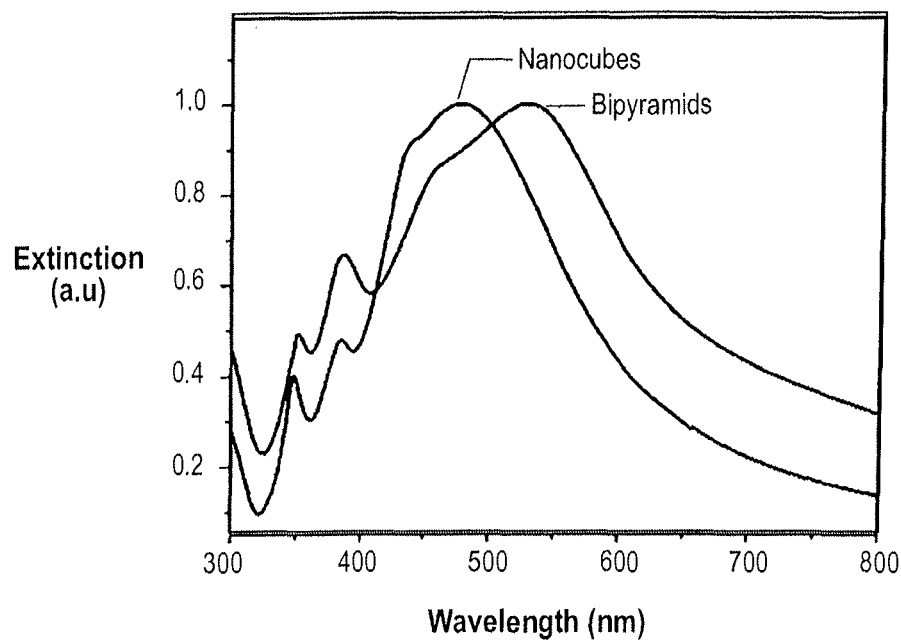
FIG. 16 shows a comparison of the UV-Vis-NIR spectra taken from aqueous solutions of silver nanocubes and bipyramids demonstrating the extinction peak of a 75 nm right bipyramid is red-shifted 50 nm from that of nanocubes of similar size.

In spite of this truncation, the extinction peak of a 75 nm right bipyramid is red-shifted 50 nm from that of nanocubes of a similar size as shown by FIG. 16. This suggests that the three corners at the junction between the two tetrahedrons of the bipyramid are significantly sharper than the corners of the cube, and thus should generate greater localized field enhancement. In addition, because one of these sharp corners will always point up and away from the substrate no matter how the bipyramid lie, it will be free from possible dampening of its localized field through electromagnetic coupling to induced charges in the substrate. The top corners of a silver nanocube (those not in contact with a substrate) have already been shown to have a figure of merit ~1.8 times that of triangular nanoprisms for single nanoparticle sensing applications; the bipyramid may further improve upon these results.

Figure 11:
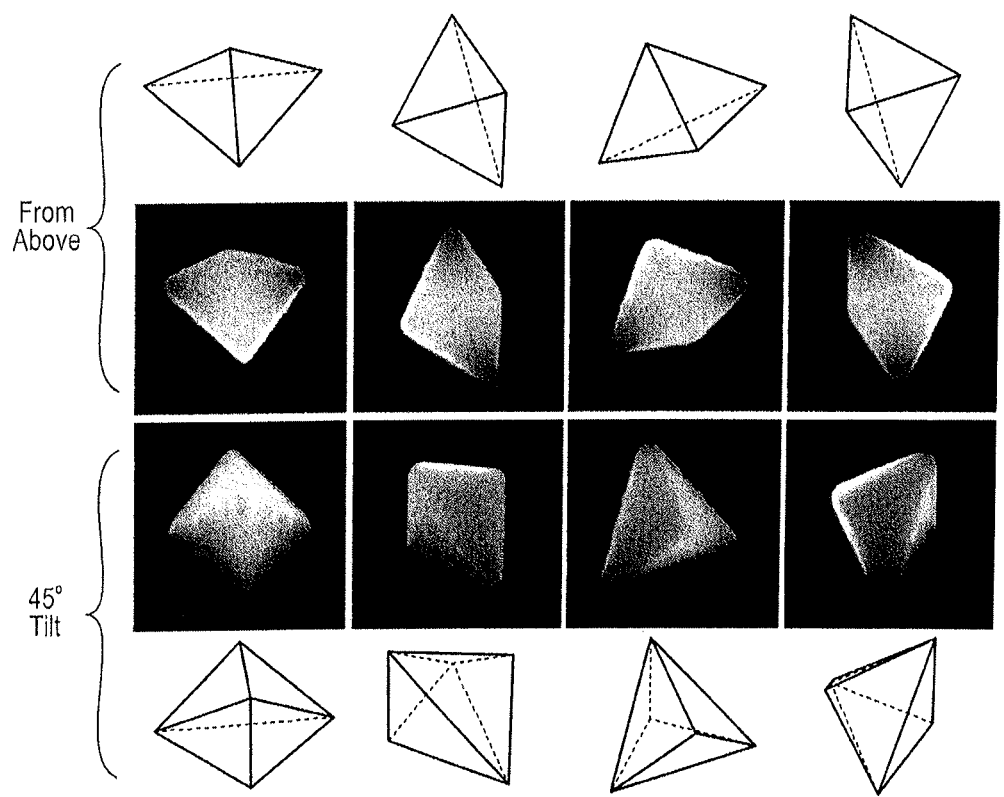
FIG. 11 shows a comparison of SEM images of a single right bipyramid with CAD models and the bipyramid is viewed under SEM from above and with a 45' tilt at four different rotations.

To visualize its shape and orientation more clearly, SEM images were taken of a single right bipyramid from above and with a 45' tilt at four different rotations. FIG. 11 compares this set of images with models (drawn with a CAD program) of a right bipyramid at identical orientations. It is very difficult to imagine the nanostructure as a right bipyramid from the top view alone, but from 45' it becomes clear that one half of the bipyramid (i.e., one of the two right tetrahedra) points away from and is not in contact with the substrate. The other right tetrahedron that makes up the bipyramid points toward and has one of its sides in contact with the substrate. The reason the bottom tetrahedron can not be seen from above is because the angles between the faces of the bipyramid are all 90°. Because one facet of the bottom tetrahedron is parallel to the substrate, the other two facets are perpendicular to the substrate and cannot be viewed from above.

Figure 12A:
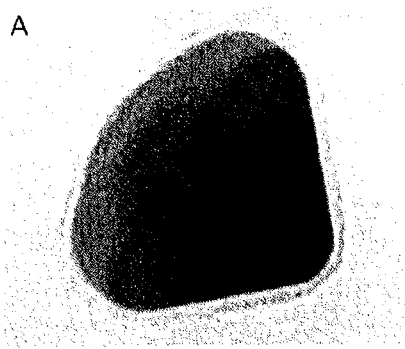
FIG. 12A shows TEM of a right bipyramid ~40 nm in edge length taken from the reaction at t=2.5 hours.
Figure 12D:
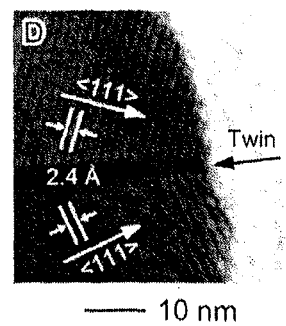
FIG. 12D shows a high resolution transmission electron microscope (HRTEM) image of a twinned seed showing the lattice fringes reflecting across the (111) twin plane.
Figure 12B:
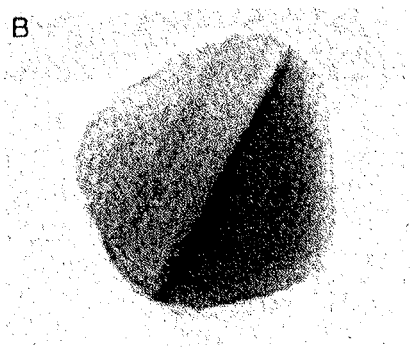
FIG. 12B shows the twin plane which bisects the bipyramid is clearly visible after tilting the particle from FIG. 12A by 45'.

The mirror symmetry of the bipyramid, as well as the fact that it is covered by (100) facets, suggests that a (111) twin plane bisects its two tetrahedra halves. In a transmission electron microscopy (TEM) image of a 40-nm bipyramid, as shown by FIG. 12A, taken from the reaction at 2.5 hours, there is an internal difference in contrast between its two halves, suggesting that it is not a single crystal. The bisecting twin plane is apparent after tilting the same bipyramid by 45' as seen in FIG. 12B, which aligns electron beam along the <110> axis, and parallel with the twin plane. The presence of the twin plane is significant because it differentiates the bipyramid from the nanocube, which is a single crystal. The difference between the shapes of bipyramid and cube is a direct result of the presence of this twin plane, because it restricts the way in which the nanoparticle can grow.

Figure 12C:
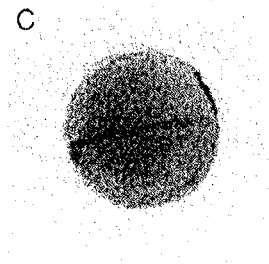
FIG. 12C shows single twinned seeds approximately 25 nm in diameter observed at t=1.5 hours.
Figure 12E:
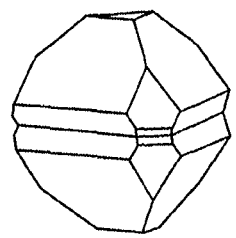
FIG. 12E is a model of the seed in FIG. 12C showing (111) truncation of corners, reentrant (111) surfaces at the twin boundary and reentrant (100) surfaces at the twin boundary corners.
Figure 17:
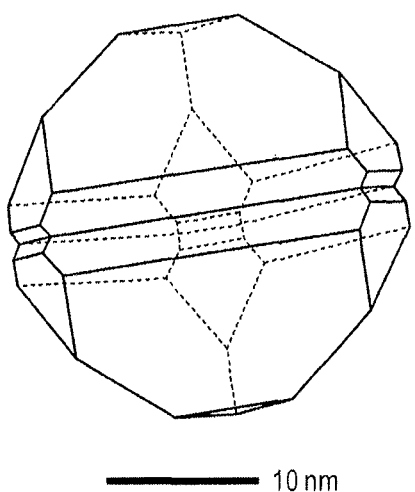
FIG. 17 shows a 3D model of a bipyramid seed obtained by truncating a model of the bipyramid till its outline matched that of the seed.

Just as nanocubes grow from smaller single-crystal seeds, it is likely the bipyramid grew from a seed with a single twin plane. Indeed, nanoparticle seeds with a single twin could readily be found in TEM images of a sample taken from the reaction at t=1.5 hours, although the fact that their twin plane is only visible at certain orientations makes it difficult to determine their yield. Another example of the twinned seed is shown in FIG. 12C. The reflection of the lattice fringes across the twin plane is evident in a high resolution TEM image of the twinned seed shown in FIG. 12D. The fringe spacing indicates the seed is aligned along the <110>, confirming that the twin is on the (111) plane. To visualize the shape of the seed, a CAD model of the bipyramid was truncated until its outline matched that of the seed as represented by FIG. 17. FIG. 12E shows an image of the approximate seed structure rendered in 3-dimensions. The differences between the seed and the bipyramid are the (111) truncation of its corners, the presence of reentrant (111) surfaces along the twin boundary, and the presence of small reentrant (100) facets at the twin boundary corners. All these changes lead to a reduction of surface area that gives the seed a more sphere-like shape. By comparing the images of the seed with those of larger bipyramids, it may be seen how the shape evolved as the nanoparticle grew. The selective growth of (100) surfaces on the twinned seed to make a right bipyramid is consistent with a likely nanocube and nanowire syntheses, in which it is hypothesized that selective capping of the (100) facet by PVP led to growth of nanostructures bounded by (100) facets.

Experimental

In one embodiment of the synthesis of right bipyramids, 5 mL ethylene glycol (EG, J. T. Baker, 9300-01) was first immersed and then heated in an oil bath set at 160° C. for 1 hour. A 30 µL drop of 10 mM NaBr was then added to the preheated EG before a syringe pump (KDS-200, Stoelting, Wood Dale, Ill.) regulated the simultaneous injection of two 3-mL EG solutions into the hot EG at a rate of 45 mL per hour. One of the solutions contained 94 mM silver nitrate (Aldrich, 209139-100G), and the other contained 144 mM poly(vinyl pyrrolidone) (PVP, Mw-55,000, Aldrich, 856568-100G, the concentration was calculated in terms of the repeating unit), and 0.11 mM NaBr (Fisher, S271-500). The ethylene glycol used for every experiment contained trace amounts of chloride (3 µM) and iron (0.4 µM). Magnetic stirring was applied throughout the entire synthesis. A set of samples were taken over the course of the synthesis using a glass pipette. To minimize temperature perturbations during sampling, the glass pipette was held just above the solution and preheated for 30 sec before immersion. The samples were washed with acetone and then with water to remove most of the EG and PVP. During the washing process, the suspension was centrifuged at 16,000 rpm for 10 min or 30 min (depending on whether acetone or water was used) to make sure that most of the silver nanoparticles taken from the reaction were recovered. Finally, the sample was dispersed in water for further characterization.

For the SEM and TEM studies, a drop of the aqueous suspension of nanostructures was placed on a piece of silicon wafer or carbon-coated copper grid (Ted Pella, Redding, Calif.), respectively, and dried in the fume hood. After that, the sample was transferred into a gravity-fed flow cell, and washed for 1 h with deionized water to remove the remaining PVP. Finally, the sample was dried and stored in a vacuum. SEM images were taken using an FEI field-emission microscope (Sirion XL) operated at an accelerating voltage of 20 kV. TEM and electron diffraction studies were performed with a Phillips 420 microscope operated at 120 kV. HRTEM images were taken using a JEOL 2010 LaB6 high-resolution transmission electron microscope operated at 200 kV. UV-Vis-NIR extinction spectra of aqueous solutions of bipyramids were taken at room temperature with a Cary 5E (Varian) spectrophotometer using a quartz cuvette with an optical path of 1 cm. XRD patterns were recorded on a Philips 1820 diffractometer equipped with a Cu-Kα radiation source (λ=1.54180 Å).

Example 4

In yet another example, the polyol synthesis may be used as a simple, robust and versatile method for producing silver nanocubes as monodispersed samples. In a typical polyol synthesis, silver atoms are formed by reducing $AgNO_3$ precursor with ethylene glycol through the following mechanism:

$$HOCH_2CH_2OH \rightarrow 2CH_3CHO + 2H_2O \quad (1)$$

$$Ag+ + 2CH_3CHO \rightarrow CH_3CO-OCCH_3 + 2Ag + 2H+ \quad (2)$$

Once the concentration of silver atoms has reached the supersaturation level, they will begin to nucleate and grow into silver nanostructures in the solution phase. Despite the demonstration of various methods for controlling polyol reduction, it is still a grand challenge to produce silver nanocubes on very large scales because of the length of time required for the formation of nanocubes from single-crystal seeds as well as the variation of reaction time between different batches. In general, a typical polyol synthesis may take anywhere from 16 to 26 hours to form silver nanocubes.

In on particular embodiment, the production rate of silver nanocubes may be improved by adding a trace amount of sodium sulfide ($Na_2S$) or sodium hydrosulfide (NaHS). Sulfide species are known to interact quite strongly with silver, such as the creation of $Ag_2S$ when silver exists at concentrations above the µM level with trace sulfides in aqueous systems. Furthermore, $Ag_2S$ nanoparticles have been shown to catalyze the reduction of Ag+ in a mechanism analogous to the autocatalytic reduction of silver clusters by drastically reducing the reduction potential compared to that of free Ag+. At this enhanced rate, the evolution of silver nanocubes is dominated by the fast kinetic growth of single-crystal seeds. As a result, it is possible to effectively limit the formation of twinned seeds and minimize the size distribution of resultant single-crystal cubes by creating a more simultaneous nucleation event, allowing all silver nanocubes to grow to the same size.

Figure 18A:
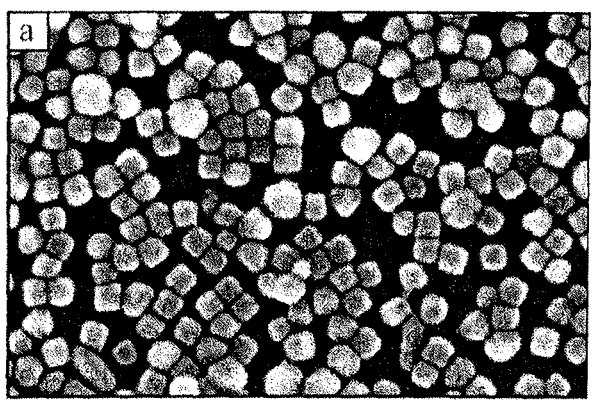
FIGS. 18A-18C showing SEM images of samples taken at different stages of a sulfide-assisted polyol synthesis: (18A) 3 minutes after the injection of silver nitrate; (18Bb) the growth of the cubes after 7 minutes into the reaction when the average edge length was increased to 45 nm; (18C) if the reaction was allowed to continue (here after 30 minutes) etching would become dominant, stopping the growth and rounding the corners of the cubes.
Figure 18B:
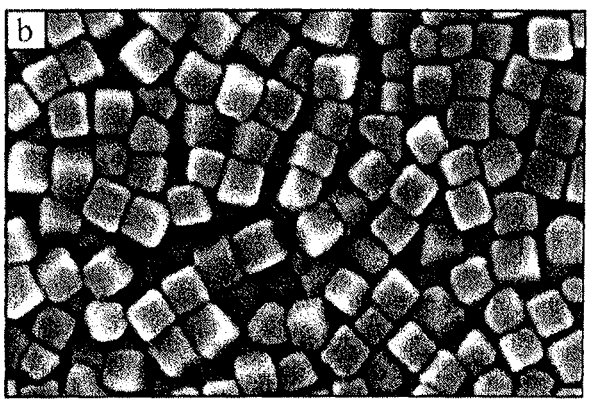
Figure 18C:
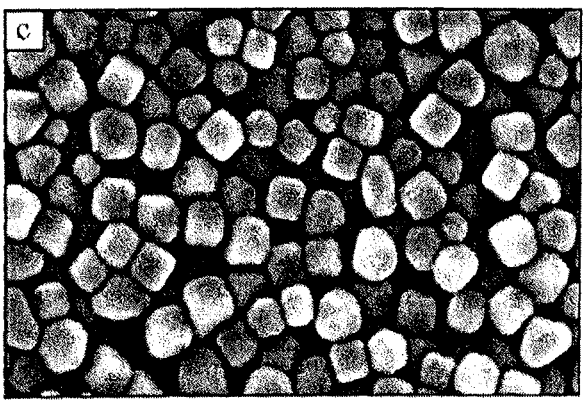
Figure 23:
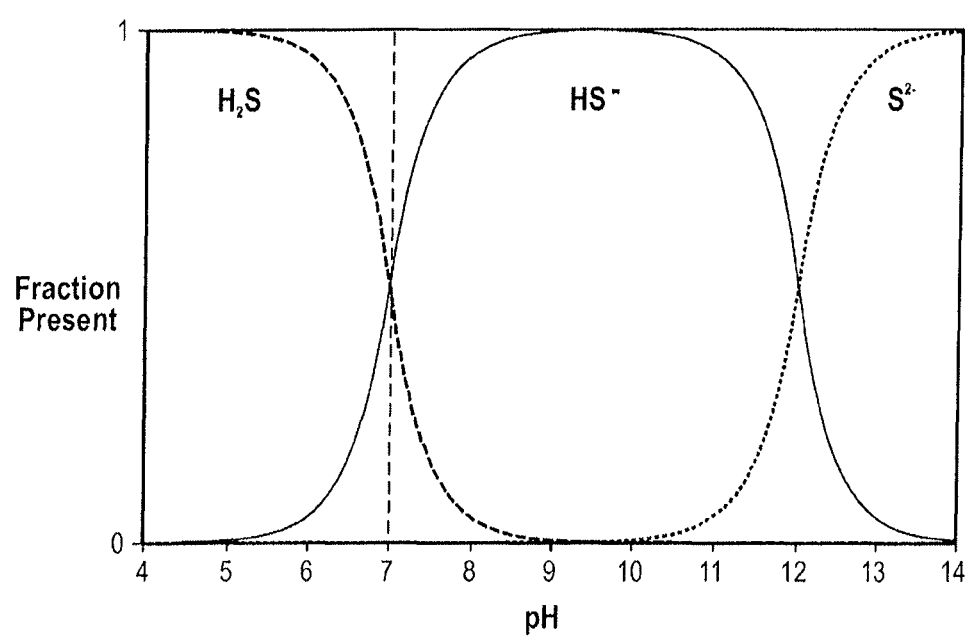
FIG. 23 shows the sulfide species present in aqueous solutions with respect to the pH of the solution.

The presence of sulfide anions accelerates the polyol synthesis of silver nanocubes due to a dramatic increase in the reduction rate of silver ions. It is known that sulfide anions exist in three states in an aqueous medium depending on the pH of the solution as shown in FIG. 23. In one example, the reaction medium was EG and the pH was close to 7 so both $H_2S$ and HS— species should be present independent of whether $Na_2S$ or NaHS was used. The purple-black color developed upon injection of silver nitrate is indicative of $Ag_2S$ nanoparticles, a catalyst for the reduction of Ag+ ions. During the synthesis, the progress of the nanoparticle production may be monitored through its color changes and shape using scanning electron microscopy (SEM). FIGS. 18A-18C show SEM images of samples taken at different stages of a typical $Na_2S$-mediated synthesis. The solution started darkening from a bright yellow to a deep orange after 3 minutes into the reaction due to the growth of small silver particles (not shown). FIG. 18A indicates that these particles were primarily cubic in profile with an average edge length of ~25 nm. Between 3 and 7 minutes, the cubes grow to 45 nm as shown in FIG. 18B, displaying a ruddy-brown color and opalescence. Once the cubes had reached 45 nm, most of the silver in the solution had been consumed and etching overtook growth as the dominant force in this system, producing nanocubes with more rounded corners as shown in FIG. 18C. At the same time, the reaction solution turned into paler, whitish brown.

Figure 19A:
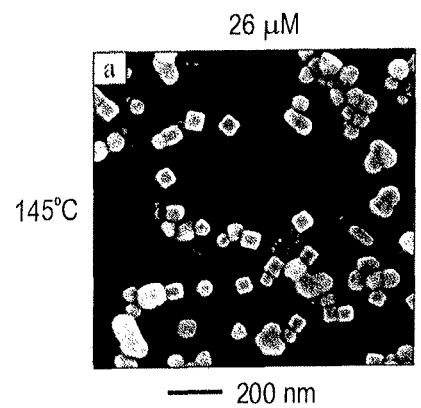
FIGS. 19A-19D show SEM images of nanostructures formed with a sodium sulfide concentration of 26 µM at different temperatures (145 to 160° C.).
Figure 19B:
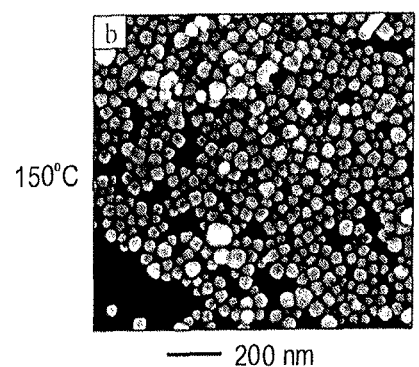
Figure 19C:
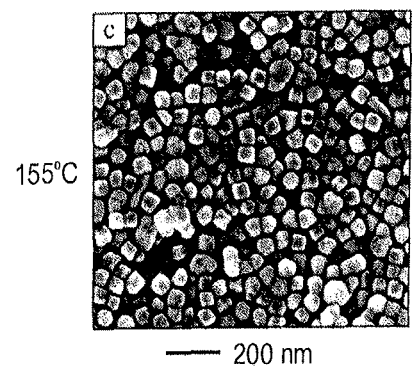
Figure 19D:
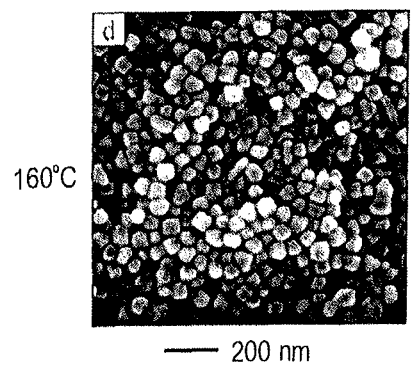
Figure 19E:
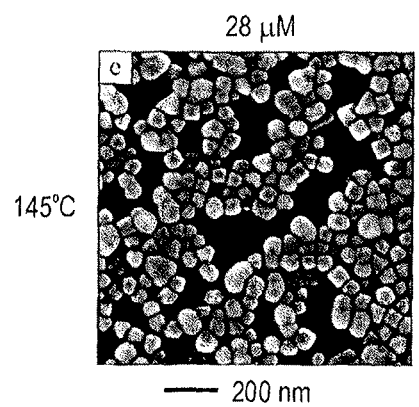
FIGS. 19E-19H show SEM images of nanostructures formed with a sodium sulfide concentration of 28 µM at different temperatures (145 to 160° C.).
Figure 19F:
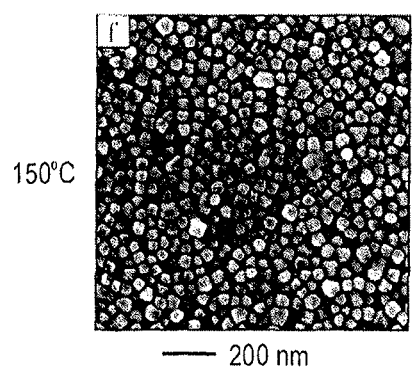
Figure 19G:
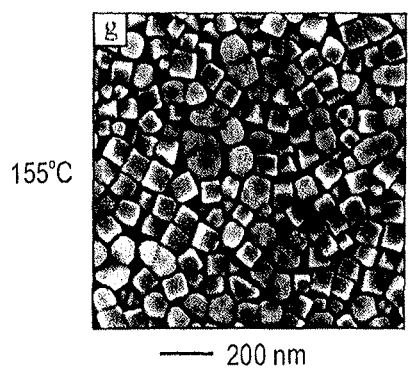
Figure 19H:
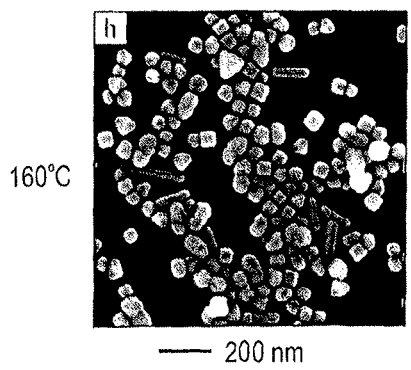
Figure 19I:
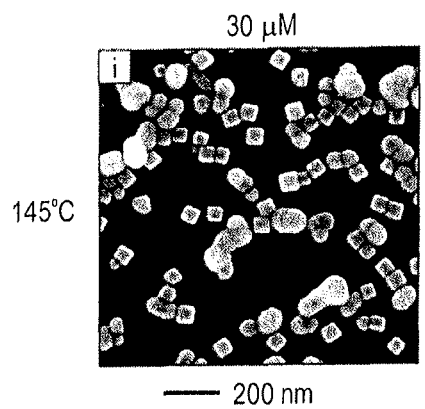
FIGS. 19I-19L show SEM images of nanostructures formed with a sodium sulfide concentration of 30 µM at different temperatures (145 to 160° C.).
Figure 19J:
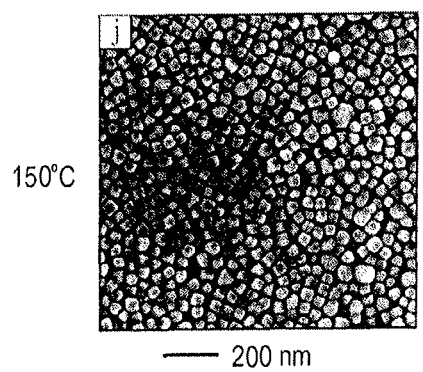
Figure 19K:
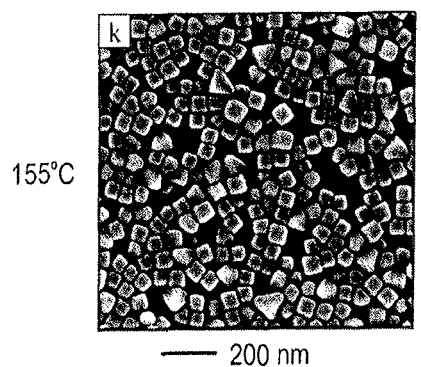
Figure 19L:
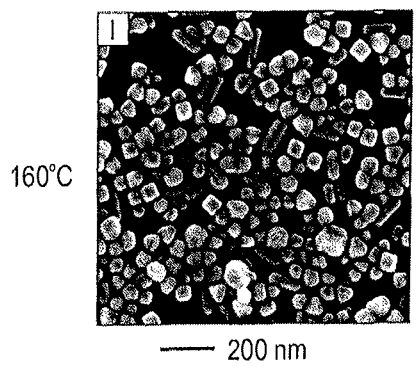
Figure 19M:
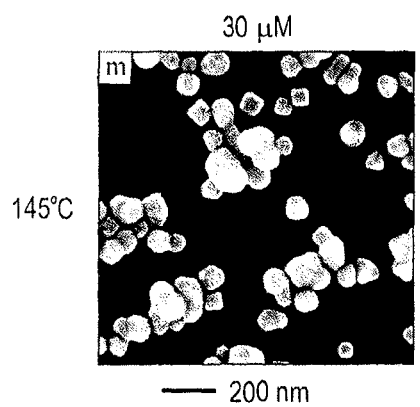
FIGS. 19M-19P show SEM images of nanostructures formed with a sodium sulfide concentration of 32 µM at different temperatures (145 to 160° C.).
Figure 19N:
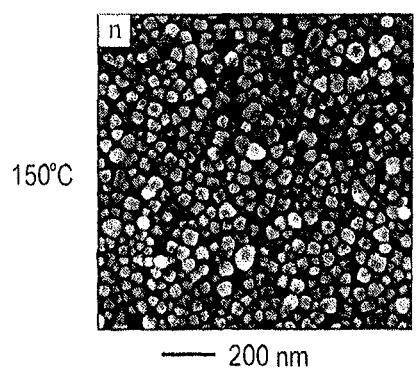
Figure 19O:
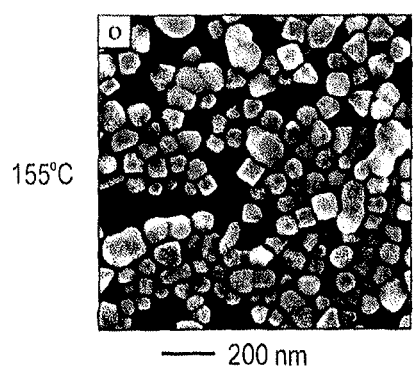
Figure 19P:
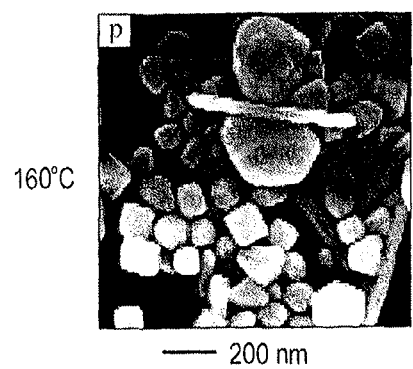

In order to better control the polyol synthesis for mass-production of monodispersed silver nanocubes, both the concentration of sulfide species and reaction temperature were adjusted. FIGS. 19A-19P show a series of SEM images of silver nanoparticles synthesized with different concentrations of $Na_2S$ at various reaction temperatures demonstrating the delicate nature of reaction conditions. In one example, 28-30 μM was a possible concentration of sulfide ions for the fast reduction of Ag+ in the range of 150-155° C. with the optimal etching conditions (temperature dependent) to produce high quality, monodispersed silver nanocubes. The concentration of sulfide species available in the reaction is very important to the synthesis of high quality small nanocubes. In this example, if the concentration of sulfide species in the solution was under 28 μM, the reduction was not fast enough to produce only the single-crystal nanocubes as there would be some round and twinned particles as seen in the images of FIGS. 19A-19D. When the concentration is higher than 30 μM, the rate of reduction may have increased beyond that of etching, favoring the production of multiply-twinned particles, wires, and agglomerated particles along with some nanocubes (FIGS. 19M-19P).

Figure 20A:
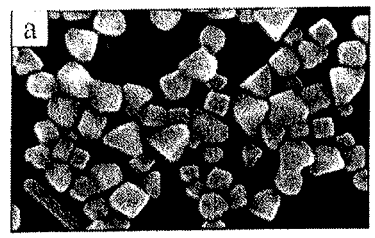
FIGS. 20A-20F SEM images of reactions containing increasing molar ratios between the repeating unit of PVP and silver nitrate. The ratios of PVP to silver nitrate were (20A) 0.77, (20B) 1.15, (20C) 1.5, (20D) 1.9, (20E) 2.3, and (20F) 0.7.
Figure 20D:
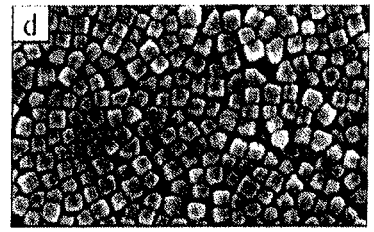
Figure 20B:
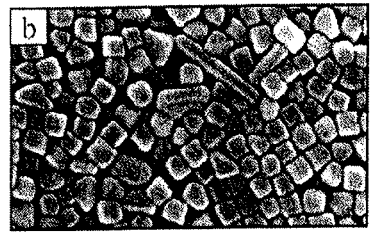
Figure 20E:
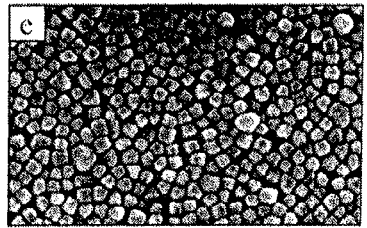
Figure 20C:
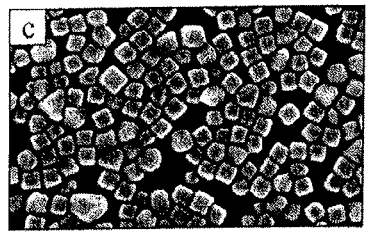
Figure 20F:
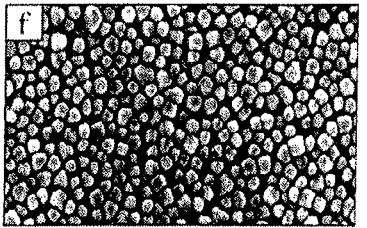

In yet another embodiment, the sulfide-assisted synthesis was further optimized by adjusting the molar ratio between the repeating unit of PVP and silver. The series of reactions in FIGS. 20A-20F show a range of molar ratios from 0.75:1 to 2.7:1 for the repeating unit of PVP to silver nitrate. PVP has been shown to preferentially adsorb onto the {100} surface of silver particles both stabilizing and protecting the small single-crystal seeds. When there was not enough PVP to lower the {100} surface energy of the small seeds sufficiently, the higher surface energy allowed for the production of twin defects, which can bee seen as single-twinned bipyramids depicted in FIG. 20A. Conversely, if there was too much PVP in the system, it would indiscriminately protect all facets of the initial seeds including the thermodynamically favored multiply-twinned, quasi-spherical seeds. These twinned species would end up as dominant products as the ratio of PVP to silver atoms became larger as seen in FIG. 20F. Therefore the ratio of PVP in the system may be balanced in order to lower the surface energy of {100} facets without overwhelming the seeds with a blanket layer that would prevent etching.

Figure 21A:
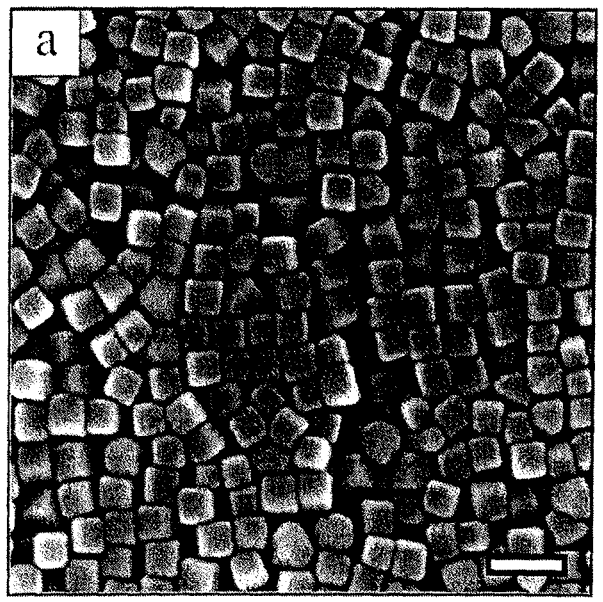
FIG. 21A shows an SEM image of silver nanocubes synthesized under the mediation of sodium sulfide (scale bar is 100 nm).
Figure 21B:
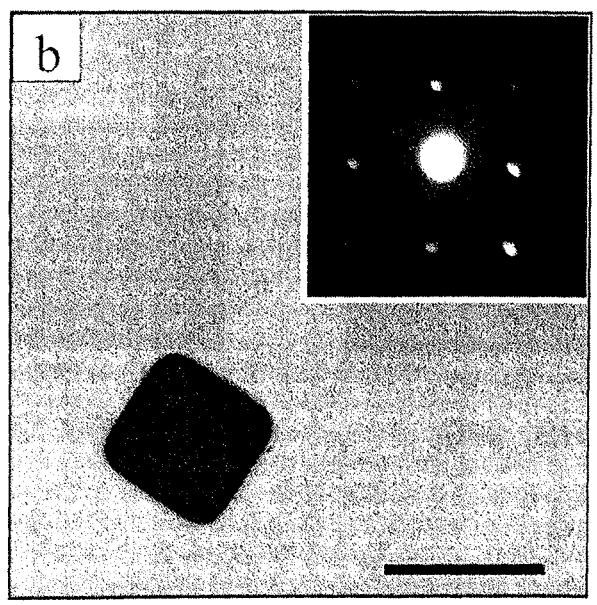
FIG. 21B shows a TEM image and electron diffraction pattern (inset) taken from a single nanocube, indicating that it is single crystal and enclosed by {100} facet (scale bar is 50 nm).
Figure 21C:
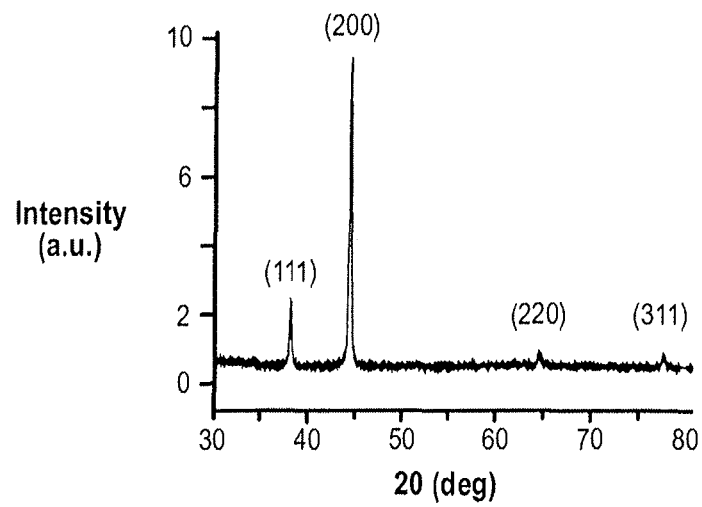
FIG. 21C an XRD pattern taken from the same batch of silver nanocubes in FIG. 21B.
Figure 21D:
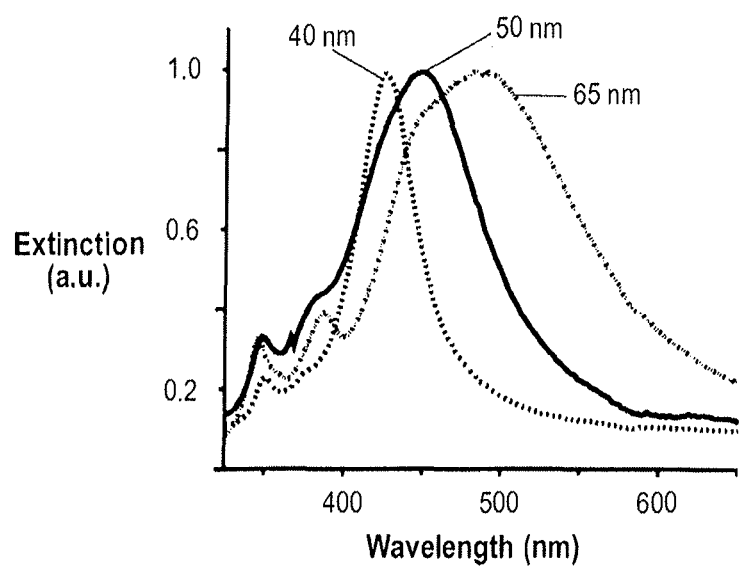
FIG. 21D is a UV-Vis spectra taken from silver nanocubes of different sizes that were all synthesized under the mediation of sodium sulfide showing that the main peak blue-shifted as the size was reduced.

In addition to scanning electron microscopy (FIG. 21A), the silver nanocubes were analyzed with transmission electron microscopy (TEM), electron diffraction, x-ray diffraction (XRD), and UV-Vis spectroscopy. FIG. 21B shows a TEM image, confirming that the particles are single-crystal cubes and the electron diffraction pattern in the inset indicates that the surface is bounded by {100} planes as expected for a cube on a flat substrate. In addition, the XRD pattern shown in FIG. 21C also suggests highly crystalline silver. Note that the (200) peak is significantly stronger relative to the (111) that dominates the JCPDS pattern mainly because the cubes were bound by {100} facets and the powder standard were overwhelmed by the lower energy {111} facets. This is expected and indicative that most nanocubes were aligned flat on the substrate with their {100} planes being oriented upward. The UV-Vis spectra of FIG. 21D shows cubes produced via the sulfide-assisted synthesis and there was a blue-shift as the edge length of the cubes decreased and became closer to spherical.

In yet another embodiment, silver nanocubes may be used as sacrificial template to generate gold nanocages. Although some sulfur ions likely to adsorb to the surface of as-synthesized cubes due to strong binding between sulfur and silver, this sulfur did not interfere with the galvanic replacement reaction between Ag and HAuCl4:

$$Ag + HAuCl_4 \rightarrow Au + HCl + 3AgCl \qquad (3)$$

Figure 22A:
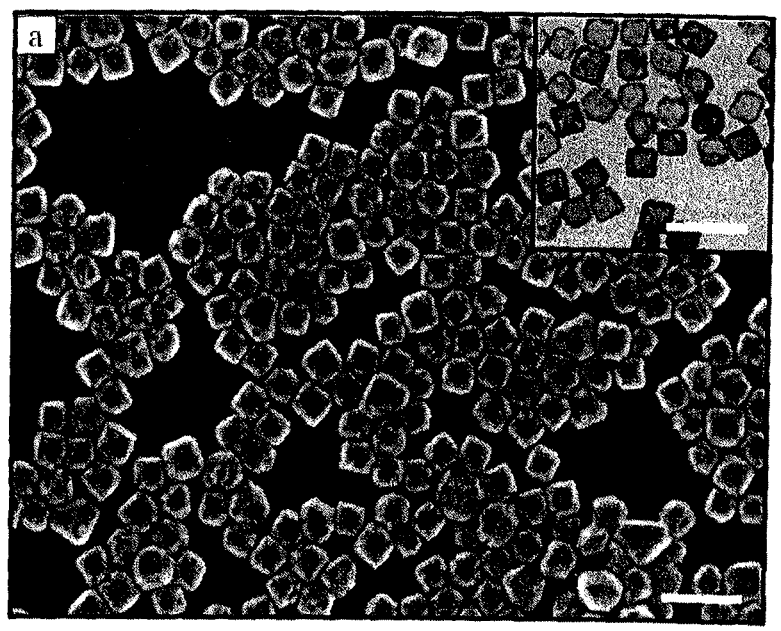
FIG. 22A shows SEM and TEM (inset) images of a sample of gold nanocages produced from silver nanocubes.
Figure 22B:
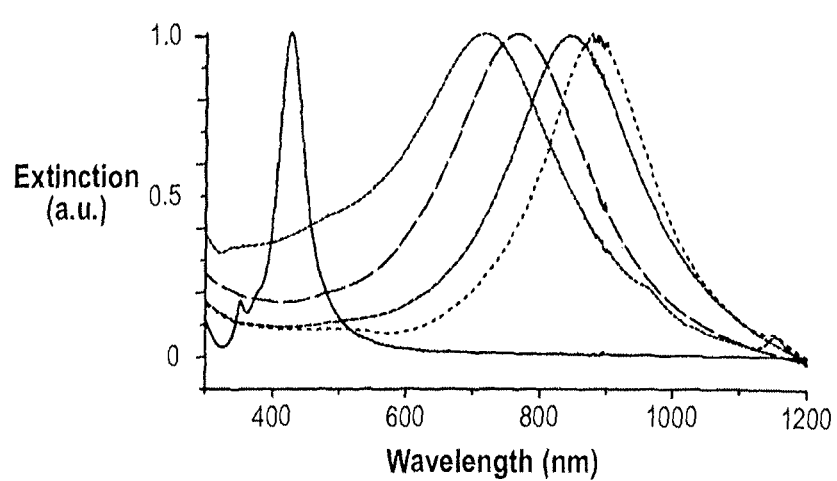
FIG. 22B shows UV-Vis extinction spectra taken from the silver nanocubes and gold nanocages.

FIG. 22A shows typical SEM and TEM (inset) images of gold nanocages produced by reacting the as-prepared Ag nanocubes with $HAuCl_4$ in an aqueous medium. It may be possible to precisely tune the surface plasmon resonance (SPR) peaks of the hollow nanostructures to any position in the visible and near-infrared regions by controlling the volume of $HAuCl_4$ added to the reaction system. For example, FIG. 22B shows the spectra taken from a set of samples, where the SPR peak had been tuned to 900 nm.

Experimental

1. Synthesis of Silver Nanocubes

In a polyol synthesis, 6 mL ethylene glycol (EG, J.T. Baker, 9300-03) was heated under stirring with a Teflon-coated magnetic stirring bar for 1 hour in a 24-mL glass vial. While the EG was heated, EG solutions containing $AgNO_3$ (48 mg/mL, Aldrich, 209139) and poly(vinyl pyrrolidone) (PVP, 20 mg/mL, MW~55,000, Aldrich, 856568) were prepared. A 3 mM solution of $Na_2S$ (Aldrich, 208043) or NaHS (Aldrich, 161527) in EG was also prepared 45 minutes prior to injection. Shortly after injecting 80 μL of the sulfide solution, 1.5 mL and 0.5 mL of the PVP and $AgNO_3$ solutions were sequentially injected (all with a micro-pipettor). As silver nitrate was added, the clear and colorless solution immediately turned purple-black, followed instantly by a transparent bright yellow color. The appearance of yellow color indicates the formation of small silver particles. After 2-3 minutes into the reaction, the solution darkened to an orange-yellow color and some silver nanoparticles were observed to deposit on the wall of the vial. After 6-8 minutes, the solution changed to an opalescent ruddy-brown and concurrently became opaque. If allowed to continue, the solution faded to a lighter, whitish-brown color but remained opaque. The final produce was diluted with acetone and collected by centrifugation, washed with water, and then suspended in water (4 mL) for future use.

2. Synthesis of Gold Nanocages

In a typical synthesis, a fixed amount (100 μL) of the as-synthesized silver nanocubes was dispersed in 5 mL water containing 1 mg/mL PVP in a 50 mL flask under magnetic stirring and then heated to boil for 10 minutes. A specific amount (3 mL) of 0.2 mM $HAuCl_4$ aqueous solution was added to the flask through a syringe pump at a rate of 45 mL/h under magnetic stirring. The solution was heated for another 10 minutes until the color of the system was stable. Once cooled down to room temperature, the sample was centrifuged and washed with saturated NaCl solution to remove AgCl and then with water several times to remove PVP and NaCl before characterization by SEM and TEM.

It will be obvious to those having skill in the art that many changes may be made to the details of the above-described embodiments without departing from the underlying principles of the invention. The scope of the present invention should, therefore, be determined only by the following claims.

The invention claimed is:

1. A method for forming silver nanostructures, the method comprising:
providing a mixture comprising: a silver precursor having silver cations ($Ag^+$), a bromide salt, a capping agent and a polyol solvent; and
converting the silver cations to silver under conditions to form crystalline silver nanostructures.

2. The method of claim 1, wherein the silver cations are provided by silver nitrate.

3. The method of claim 1, wherein the mixture further comprises a chloride salt.

4. The method of claim 1, wherein the capping agent is polyvinyl pyrrolidone.

5. The method of claim 1, wherein the polyol solvent is ethylene glycol.

6. The method of claim 1, wherein at least one dimension of the silver nanostructure is less than 100 nm.

7. The method of claim 1, wherein the nanostructures are nanowires.

8. The method of claim 1, wherein the conditions comprise heating the mixture.

9. The method of claim 8, wherein heating the mixture comprises heating to 140-160° C.

10. A method for forming silver nanowires, the method comprising:
mixing, in a polyol solvent, a silver precursor comprising silver cations ($Ag^+$), a salt comprising bromide anions, a salt comprising chloride anions, and a capping agent; and
chemically reducing the silver precursor to silver under conditions to form silver nanowires.

11. The method of claim 10, wherein the silver precursor is silver nitrate.

12. The method of claim 10, wherein the salt comprising bromide anions is bromide salt.

13. The method of claim 10, wherein the capping agent is polyvinyl pyrrolidone.

14. The method of claim 10, wherein the polyol solvent is ethylene glycol.

15. The method of claim 10, wherein the conditions include heating the mixture, and wherein heating the mixture comprises heating to 140-160° C.

16. A method for forming silver nanowires, the method comprising:
forming a mixture of silver precursor having silver cations ($Ag^+$), a bromide salt, a chloride salt, a capping agent and a polyol; and
heating the mixture whereby the silver cations are chemically reduced to form silver nanowires.

17. The method of claim 16, wherein the silver precursor is silver nitrate.

18. The method of claim 16, wherein the capping agent is polyvinyl pyrrolidone.

19. The method of claim 16, wherein the polyol is ethylene glycol.

* * * * *